US 10,170,502 B2

(12) United States Patent
Jeong et al.

(10) Patent No.: US 10,170,502 B2
(45) Date of Patent: Jan. 1, 2019

(54) TRANSISTOR ARRAY PANEL AND MANUFACTURING METHOD THEREOF

(71) Applicant: Samsung Display Co., Ltd., Yongin-si (KR)

(72) Inventors: Yu-Gwang Jeong, Anyang-si (KR); Hyun Min Cho, Hwaseong-si (KR); Su Bin Bae, Gyeongsan-si (KR); Shin Il Choi, Hwaseong-si (KR); Sang Gab Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/380,596

(22) Filed: Dec. 15, 2016

(65) Prior Publication Data

US 2017/0317104 A1    Nov. 2, 2017

(30) Foreign Application Priority Data

Apr. 29, 2016 (KR) .................. 10-2016-0053466

(51) Int. Cl.
| H01L 27/12 | (2006.01) |
| H01L 29/417 | (2006.01) |
| H01L 21/311 | (2006.01) |
| G02F 1/1368 | (2006.01) |
| H01L 27/32 | (2006.01) |

(52) U.S. Cl.
CPC ...... *H01L 27/124* (2013.01); *H01L 21/31116* (2013.01); *H01L 21/31144* (2013.01);
(Continued)

(58) Field of Classification Search
CPC ........ H01L 29/78633; H01L 29/78666; H01L 29/78675
(Continued)

(56) References Cited

U.S. PATENT DOCUMENTS

2010/0006851 A1* 1/2010 Park .................. H01L 29/41733
257/72
2010/0148155 A1   6/2010 Choi et al.
(Continued)

FOREIGN PATENT DOCUMENTS

KR    10-2008-0020725    3/2008
KR    10-0325668    3/2008
(Continued)

OTHER PUBLICATIONS

The Extended European Search Report dated Aug. 2, 2017, issued in European Patent Application No. 17155312.6.

*Primary Examiner* — David Vu
*Assistant Examiner* — Brandon Fox
(74) *Attorney, Agent, or Firm* — H.C. Park & Associates, PLC

(57) ABSTRACT

A transistor array panel is manufactured by a method that reduces or obviates the need for highly selective etching agents or complex processes requiring multiple photomasks to create contact holes. The panel includes: a substrate; a buffer layer positioned on the substrate; a semiconductor layer positioned on the buffer layer; an intermediate insulating layer positioned on the semiconductor layer; and an upper conductive layer positioned on the intermediate insulating layer, wherein the semiconductor layer includes a first contact hole, the intermediate insulating layer includes a second contact hole positioned in an overlapping relationship with the first contact hole, and the upper conductive layer is in contact with a side surface of the semiconductor layer in the first contact hole.

20 Claims, 37 Drawing Sheets

(52) U.S. Cl.
CPC ...... H01L 27/1218 (2013.01); H01L 27/1288 (2013.01); H01L 29/41733 (2013.01); *G02F 1/1368* (2013.01); *G02F 2201/123* (2013.01); *H01L 27/3246* (2013.01); *H01L 27/3248* (2013.01); *H01L 27/3262* (2013.01); *H01L 27/3276* (2013.01)

(58) Field of Classification Search
USPC ........................................ 257/43, 72; 349/46
See application file for complete search history.

(56) References Cited

U.S. PATENT DOCUMENTS

| | | | |
|---|---|---|---|
| 2014/0042428 A1* | 2/2014 | Ning | H01L 29/66969 257/43 |
| 2015/0187959 A1* | 7/2015 | Yoon | H01L 27/1225 257/43 |
| 2016/0071891 A1* | 3/2016 | Oh | H01L 27/1248 257/72 |
| 2016/0093647 A1* | 3/2016 | Kim | G02F 1/136227 349/46 |
| 2017/0194404 A1* | 7/2017 | Park | H01L 27/3262 |

FOREIGN PATENT DOCUMENTS

| | | |
|---|---|---|
| KR | 10-2013-0111872 | 10/2013 |
| KR | 10-2014-0081413 | 7/2014 |
| KR | 10-20050045111 | 4/2015 |
| KR | 10-2015-0080355 | 7/2015 |

\* cited by examiner

TRANSISTOR ARRAY PANEL AND MANUFACTURING METHOD THEREOF

CROSS-REFERENCE TO RELATED APPLICATION

This application claims priority from and the benefit of Korean Patent Application No. 10-2016-0053466, filed on Apr. 29, 2016, which is hereby incorporated by reference for all purposes as if fully set forth herein.

BACKGROUND

Field

Exemplary embodiments employing the inventive concepts relate generally to a transistor array panel and a manufacturing method thereof, and, more particularly, to a transistor array panel and manufacturing method that obviates the need for highly selective etching agents or complex processes requiring multiple photomasks to create contact holes that provide electrical connections in the transistor array panel.

Discussion of the Background

Transistors are used in various electronic devices such as a flat panel display. The transistor includes a gate electrode and a semiconductor layer overlapping the gate electrode via a gate insulating layer and a channel region. The semiconductor layer may further include a source region and a drain region connected to the channel region, and the source region and the drain region may face each other via the channel region.

The semiconductor layer is a factor in determining the characteristics of the transistor. For the semiconductor layer, an amorphous silicon semiconductor, a polysilicon semiconductor, a metal oxide semiconductor, or the like are used.

A transistor array panel includes the transistor and various conductive layers for driving the transistor. The gate electrode, the semiconductor layer, and the various conductive layers configuring the transistor may be positioned at various layers with the insulating layer there between, as can be depicted by a cross-sectional structure. The insulating layer includes a contact hole for electrical connection between the gate electrode, the semiconductor layer, and various layers of the transistor. A process for etching the insulating layer is sometimes required to form the contact hole.

In a manufacturing process of the transistor array panel, conventional etching processes have issues, e.g., during the process of forming contact holes highly selective etching agents or multiple photomasks may be required, which increase costs and further complicate the manufacturing process.

The above information disclosed in this Background section is only for enhancement of understanding of the background of the inventive concepts and, therefore, it may contain information that does not form the prior art that is already known in this country to a person of ordinary skill in the art.

SUMMARY

Various exemplary embodiments employing the inventive concepts may reduce or entirely solve the issues with conventional etching processes. For example, the invention reduces the manufacturing cost and the manufacturing time of the transistor array panel and simplifies the manufacturing process by forming contact holes connected to the electrode or the conductive layer of various depths without the necessity of a process using an etching material with a high selectivity or increasing of the number of photomasks. In other words, processes conducted according to the principles of the invention permit etching of multiple contact holes in different materials and to different depths without the need for these complex processing steps or materials, and enable etching of different materials simultaneously. Also, various embodiments described herein may facilitate control of a remaining amount (thickness) of the semiconductor layer, increase the process margin, and/or improve the characteristics of the transistor by reducing damage to the semiconductor layer in the process of forming the contact hole. For example, conventional (low to medium selectivity) etching agents may be used without increasing the number of masks and without concern for tightly controlling the etching process to prevent inadvertent etching of other layers.

Additional aspects of the inventive concepts will be set forth in the detailed description which follows, and, in part, will be apparent from the disclosure, or may be learned by practice of the inventive concept.

According to a first aspect of the invention, a transistor array panel constructed according to the inventive concepts includes a substrate, a buffer layer positioned on the substrate, a semiconductor layer positioned on the buffer layer, an intermediate insulating layer positioned on the semiconductor layer, and an upper conductive layer positioned on the intermediate insulating layer, wherein the semiconductor layer includes a first contact hole, the intermediate insulating layer includes a second contact hole positioned in an overlapping relationship with the first contact hole, and the upper conductive layer is in contact with a side surface of the semiconductor layer in the first contact hole.

A cross sectional area of the second contact hole may be larger than a cross sectional area of the first contact hole.

The upper conductive layer may be in contact with an upper surface of the semiconductor layer at a shoulder at a bottom of the second contact hole.

The first contact hole may extend to or into an upper surface of the buffer layer such that the first contact hole passes entirely through the semiconductor layer on the buffer layer.

The first contact hole may extend into the buffer layer such that a cross-sectional thickness of the buffer layer overlapping the first contact hole is smaller than a cross-sectional thickness of the buffer layer that does not overlap the first contact hole.

The upper conductive layer may be in contact with the buffer layer in the first contact hole.

The first contact hole may extend entirely through the semiconductor layer and into, but not entirely through, the buffer layer.

The transistor array panel may further include a lower conductive layer positioned between the substrate and the buffer layer, wherein the buffer layer includes a third contact hole positioned over and exposing the lower conductive layer, the intermediate insulating layer includes a fourth contact hole positioned in an overlapping relationship with the third contact hole, and the lower conductive layer includes a different material from a material of the semiconductor layer.

A cross sectional area of the fourth contact hole may be larger than a cross sectional area of the third contact hole.

The upper conductive layer may be in contact with an upper surface of the buffer layer in the fourth contact hole, and may be in contact with an upper surface of the lower conductive layer in the third contact hole.

The fourth contact hole may extend into the buffer layer.

Each of the first, second, third and fourth contact holes may have a side surface defining the width of its respective hole, with at least one of the side surfaces having a substantially constant slope.

The lower conductor may be a data line.

A slope of a side surface of the first contact hole may be different than a slope of a side surface of the second contact hole.

The upper conductive layer may include a pixel electrode layer.

The substrate, the buffer layer, the semiconductor layer, the intermediate insulating layer and the upper conductive layer may be a portion of a display panel.

According to another aspect of the invention, an exemplary method of manufacturing a transistor array panel includes forming a buffer layer on a substrate, forming a semiconductor layer on the buffer layer, forming an intermediate insulating layer on the semiconductor layer, forming a first mask pattern on the intermediate insulating layer, forming a first etching hole in the intermediate insulating layer by using the first mask pattern as an etching mask, removing a part of the first mask pattern to form a second mask pattern exposing an upper surface of the intermediate insulating layer around the first etching hole of the intermediate insulating layer, and removing the intermediate insulating layer and the semiconductor layer by using the second mask pattern as an etching mask to form a first contact hole in the semiconductor layer and a second contact hole in the intermediate insulating layer.

The method of manufacturing a transistor array panel may further include, after forming the second contact hole, removing the second mask pattern, and forming an upper conductive layer on the intermediate insulating layer, and the upper conductive layer may be in contact with a side surface of the semiconductor layer in the first contact hole.

Before forming the buffer layer, a lower conductive layer may be formed on the substrate, during the steps of forming the first contact hole and the second contact hole, the intermediate insulating layer and the buffer layer may be removed by using the second mask pattern as the etching mask to form a third contact hole of the buffer layer and a fourth contact hole of the intermediate insulating layer, and the third contact hole may expose an upper surface of the lower conductive layer.

The first and third holes may be simultaneously formed in the same process step, and the second and fourth holes may be simultaneously formed in the same process step.

The step of forming the first contact hole may include removing at least part of the buffer layer corresponding to the first etching hole.

In various exemplary embodiments, only one mask is used in the process of forming the first contact hole and the second contact hole.

In various exemplary embodiments, only etching material having a low or medium selectivity is used in the steps of forming the first etching hole, the first contact hole and the second contact hole.

According to another exemplary embodiment of the invention, a method for manufacturing a transistor array panel includes forming a buffer layer on a substrate, forming a semiconductor layer on the buffer layer, forming an intermediate insulating layer on the semiconductor layer, forming a first mask pattern on the intermediate insulating layer, and etching the first mask pattern, the intermediate insulating layer, the buffer layer, and the semiconductor layer that are not covered by the first mask pattern together to expose a side surface of the intermediate insulating layer, the buffer layer, and the semiconductor layer.

In the etching step, an etching gas may be used such that an etch rate of the etching gas for the first mask pattern is higher than an etch rate for the intermediate insulating layer.

The method for manufacturing a transistor array panel may further include after forming the first mask pattern, forming a first hole in the intermediate insulating layer by using the first mask pattern as an etching mask.

According to another exemplary embodiment employing the inventive concepts, a display panel includes a transistor array that has a substrate, a semiconductor layer positioned on the substrate, an intermediate insulating layer positioned on the semiconductor layer, and an upper conductive layer positioned on the intermediate insulating layer. The semiconductor layer and intermediate insulating layer may define a first contact hole having a stepped, cross sectional shape. The upper conductive layer may be in contact with a side surface of the intermediate insulating layer at an upper portion of the first contact hole. The upper conductive layer may be in contact with a side surface of the semiconductor layer at a lower portion of the first contact hole.

The upper portion of the first contact hole may have a first width, the lower portion of the first contact hole may have a second width smaller than the first width and the first contact hole may have a shoulder at an intersection between the first and second widths.

The stepped shape of the first contact hole may be defined by a bottom surface of an upper portion of the first contact hole, a bottom surface of a the lower portion of the first contact hole, and a side wall connecting the bottom surfaces.

The display panel may further comprise a buffer layer. The upper conductive layer may be in contact with the buffer layer at a bottom portion of the first contact hole.

The semiconductor layer and intermediate insulating layer may further define a second contact hole having a stepped shape.

The buffer layer and the intermediate insulating layer may define a third contact hole having a stepped shape. And, the buffer layer and the intermediate insulating layer further define a fourth contact hole having a stepped shape.

According to yet another exemplary embodiment employing the inventive concepts, a layered transistor structure includes a first layer, a second layer positioned adjacent the first layer and having a peripheral portion and a central portion, a third layer positioned adjacent the second layer at the central portion, the third layer not extending beyond the central portion to the peripheral portion, a fourth layer positioned adjacent the third layer at the central portion and directly on the second layer at the peripheral portion, a peripheral contact hole passing entirely through the fourth layer and entirely through the second layer to an upper surface of the first layer at the peripheral portion, and a central contact hole passing entirely through the fourth layer and at least partially into the third layer at the central portion.

According to still another exemplary embodiment employing the inventive concepts, a transistor array panel includes a first insulating layer defining a first portion of a contact hole extending entirely through the insulating layer, a semiconductor layer positioned adjacent the first insulating layer at a location of the contact hole and defining a second portion of the contact hole extending entirely through the semiconductor layer, and a second insulating layer positioned adjacent the semiconductor layer at the location of the contact hole and defining a third portion of the contact hole that extends only partially into the second insulating layer. The contact hole may include a transition such as 1) a shoulder connecting the first and second portions of the contact hole, 2) two different levels within the third portion of the contact hole, the two different levels within the third portion of the contact hole being connected by a shoulder within the third portion of the contact hole, or 3) a junction between the first and second portions of the contact hole defining a transition between a first slope of a sidewall of the first portion and a second slope of a sidewall of the second portion, the first slope and the second slope being different.

According to the foregoing inventive concepts and exemplary embodiments, it is not necessary to use difficult etching processes requiring increased numbers of photomasks nor etching materials having high selectivity to form contact holes of various depths and in different layers, whereby the cost and the time to manufacture the transistor array panel may be reduced and the manufacturing process may be simplified. Also, the inventive concepts facilitate easy control of the remaining thickness of the semiconductor layer, increasing the process margin, and/or improving the characteristics of the transistor.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
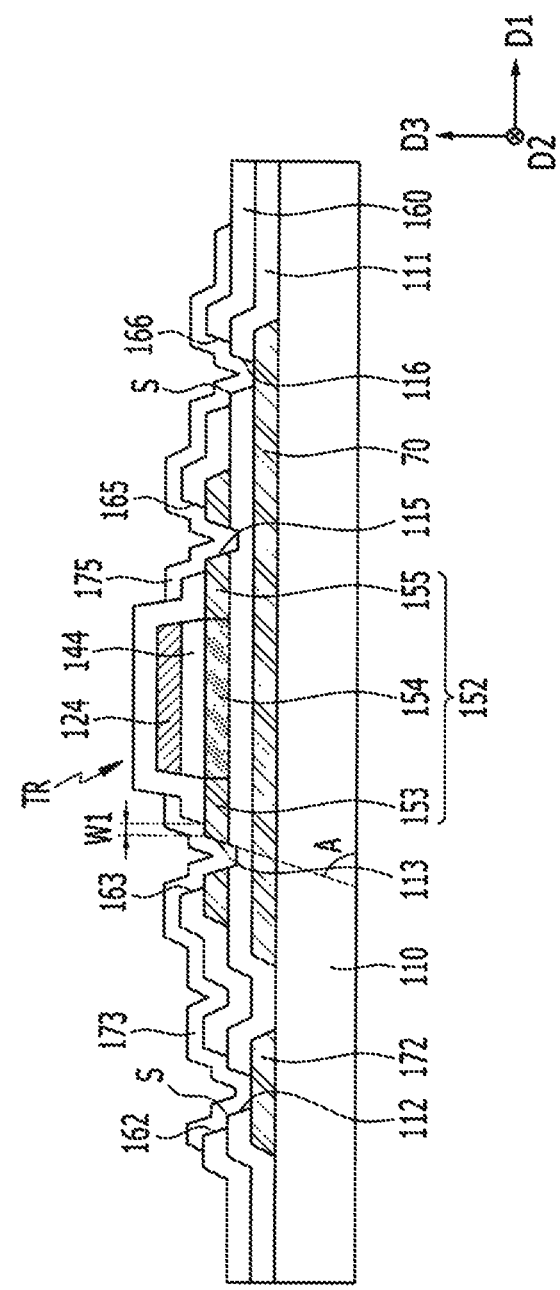
FIG. 1 is a cross-sectional view of a transistor array panel constructed according to the principles of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Referring to FIG. 1, the transistor array panel according to a first exemplary embodiment constructed according to the principles of the invention includes a substrate 110 and a plurality of transistors TR positioned on one surface of the substrate 110. FIG. 1 only shows one transistor TR for convenience.

A first direction D1 and a second direction D2 shown in FIG. 1 are parallel to a surface shown when viewing in a direction perpendicular to a surface of the substrate 110 and are perpendicular to each other, and a third direction D3 is perpendicular to the first and second directions D1 and D2 and is substantially perpendicular to the surface of the substrate 110. The third direction D3 may be mainly represented in the cross-sectional structure and is referred to as a cross-sectional direction. A structure shown when observing in the third direction D3 is referred to as a plan structure. A view in the third directions D3 is referred to as a plan view.

An area of an object or feature in a plan view is referred to herein as a plan area. The magnitude of a plan area is referred to herein as a plan size. Similarly, a shape of an object or feature in a plan view is referred to herein as the plan shape of that object or feature. Thus, whereas FIG. 1 is a cross-sectional view in direction D2, when viewed from above, a top view of the same structure, which is a view in direction D3, is a plan view of the structure. In the cross-sectional structure, if a constituent element is positioned on any other constituent element, it means that two constituent elements are arranged in the third direction D3, and other constituent elements may be positioned between the two constituent elements.

The substrate 110 includes an insulating material such as plastic, glass, etc., and may have flexibility. A partial region of the substrate 110 may be removed if necessary.

The transistor TR includes a semiconductor layer 152, an upper electrode 124, and an insulating layer 144 positioned between the semiconductor layer 152 and the upper electrode 124.

The semiconductor layer 152 includes a channel region 154 formed of a channel of the transistor TR, and a source region 153 and a drain region 155 respectively positioned at opposing sides of the channel region 154. The source region 153 and the drain region 155 are positioned in the same layer as the channel region 154 and are connected to the channel region 154.

The source region 153, the drain region 155, and the channel region 154 may include the same material, for example, a metal oxide, a polysilicon, or amorphous silicon. When the source region 153, the drain region 155, and the channel region 154, include the metal oxide, it may be, for example, zinc oxide (ZnO), zinc-tin oxide (ZTO), zinc-indium oxide (ZIO), indium oxide (InO), titanium oxide (TiO), indium-gallium-zinc oxide (IGZO), or indium-zinc-tin oxide (IZTO).

A carrier concentration of the source region 153 and the drain region 155 is larger than a carrier concentration of the channel region 154, and the source region 153 and the drain region 155 may be conductive. A gradient region where the carrier concentration is gradually changed may be formed between the source region 153 and the drain region 155, and the channel region 154.

The source region 153 and the drain region 155 may be formed by making part of the semiconductor material conductive by a method such as plasma treatment after depositing the semiconductor material on the substrate 110. For example, after depositing the metal oxide semiconductor material on the substrate 110, the metal oxide semiconductor material may be doped with a gas including at least one among fluorine (F), hydrogen (H), and sulfur (S) in a chamber to form the source region 153 and the drain region 155. In this case, the part that is not doped with the impurity remains as the channel region 154.

In various embodiments, a thickness of the semiconductor layer 152 in the third direction D3 is about 400 Å. In other embodiments, the thickness of the semiconductor layer 152 may be different depending upon the particular application and process.

The upper electrode 124 overlaps the channel region 154 with the insulating layer 144 interposed there-between. The upper electrode 124 may include a conductive material such as a metal. The upper electrode 124 may function as a gate electrode of the transistor TR.

The insulating layer 144 may include an inorganic insulating material such as a silicon oxide (SiOx), a silicon nitride (SiNx), or a silicon oxynitride (SiON), or an organic insulating material, and may be a single layer or a multilayer including at least one among these materials.

Most of the insulating layer 144 may only be positioned between the semiconductor layer 152 and the upper electrode 124. In this case, the edge of the upper surface or the lower surface of the gate insulator 144 may be substantially parallel to the edge of the lower surface and the upper surface of the upper electrode 124. To be substantially parallel to each other at two edges means that two edges accord or are aligned with each other or are parallel to each other within a predetermined distance even if they are not precisely matched, and it is the same in the following description. That is, in a plan structure of the transistor array panel, the plan shape of the insulating layer 144 may be substantially the same as the plan shape of the upper electrode 124. The insulating layer 144 may cover most of the channel region 154 of the semiconductor layer 152. This is because the upper electrode 124 and the insulating layer 144 are formed by using one photomask in the manufacturing process of the transistor array panel.

Differently from FIG. 1, in various embodiments the insulating layer 144 is not limited to the region between the upper electrode 124 and the semiconductor layer 152, and may be continuously formed on the substrate 110. In such embodiments, the insulating layer 144 may also be positioned on the source region 153 and the drain region 155 of the transistor TR.

The planar shape of the channel region 154 of the semiconductor layer 152 may be substantially the same as the planar shape of the upper electrode 124. In other words, the edge of the channel region 154 may be substantially parallel and may be approximately aligned to the edge of the upper electrode 124. The boundary between the channel region 154 and the source region 153 and the boundary between the channel region 154 and the drain region 155 may be substantially parallel or may be aligned to the edge of the upper electrode 124.

In various embodiments, a buffer layer 111 is positioned between the substrate 110 and the transistor TR. The buffer layer 111 functions as an insulating layer and may have a single layer or multilayer structure including at least one of the inorganic insulating materials such as a silicon oxide (SiOx), a silicon nitride (SiNx), or an organic insulating material. The buffer layer 111 may prevent an impurity from flowing into the semiconductor layer 152 from the substrate 110, thereby protecting the semiconductor layer 152 and preventing characteristic degradation of the semiconductor layer 152.

The buffer layer 111, as shown in FIG. 1, may be substantially and continuously formed on the substrate 110, or alternatively, may only be formed in a partial region of the substrate 110. For example, the buffer layer 111 may be patterned to only be positioned between the semiconductor layer 152 and the substrate 110.

The thickness of the buffer layer 111 in the third direction D3 may be similar to the thickness of the intermediate insulating layer 160 in the third direction D3, however it is not limited thereto, and it may be thicker or thinner than the thickness of the intermediate insulating layer 160 in the third direction D3.

In various embodiments, a lower conductive layer including a lower electrode 70 and a lower conductor 172 is positioned between at least some transistors TR among the plurality of transistors TR included in the transistor array panel and the substrate 110. In some embodiments, the lower electrode 70 and the lower conductor 172 are positioned with the same layer in the cross-sectional structure, and are positioned between the buffer layer 111 and the substrate 110. The lower electrode 70 and the lower conductor 172 may include the same material.

The lower electrode 70 overlaps the semiconductor layer 152 in the third direction D3 such that the semiconductor layer 152 may be covered by the lower electrode 70 when viewed in a lower surface direction of the substrate 110, i.e., when viewed in a direction from the bottom of the page in FIG. 1.

The lower electrode 70 may have various functions, and one among them may be a light blocking function for the semiconductor layer 152. The lower electrode 70 prevents external light from reaching the semiconductor layer 152, thereby preventing a characteristic deterioration of the semiconductor layer 152 caused by exposure to light, and thereby suppressing a leakage current of the transistor TR. As another function of the lower electrode 70, in embodiments where the lower electrode 70 is electrically connected to one electrode of the transistor TR to be applied with the voltage, a uniform output current characteristic may be obtained in a saturation region of the transistor TR.

The lower conductor 172 may transmit a signal such as a data voltage, a driving voltage, and the like. For example, when the lower conductor 172 transmits the data voltage, the lower conductor 172 may be a part of the data line or may be connected to the data line.

The lower conductive layer (including the lower electrode 70 and the lower conductor 172) may include a different material from the semiconductor layer 152, and for example, may include a metal such as copper (Cu) or other conductive materials.

In various embodiments, an intermediate insulating layer 160 may be positioned on the transistor TR. The intermediate insulating layer 160 may be a single layer or multilayer. The intermediate insulating layer 160 may include an inorganic insulating material such as a silicon oxide (SiOx), a silicon nitride (SiNx), or an organic insulating material.

Referring to FIG. 1 to FIG. 5, the intermediate insulating layer 160 includes a contact hole 162 positioned on or over the lower conductor 172 and overlapping the lower conductor 172, a contact hole 166 positioned on or over the lower electrode 70 and overlapping the lower electrode 70, a contact hole 163 positioned on or over the source region 153 of the semiconductor layer 152 and overlapping the source region 153, and a contact hole 165 positioned on or over the drain region 155 of the semiconductor layer 152 and overlapping the drain region 155. In the contact holes 162, 163, 165, and 166, the intermediate insulating layer 160 is removed.

Figure 2:
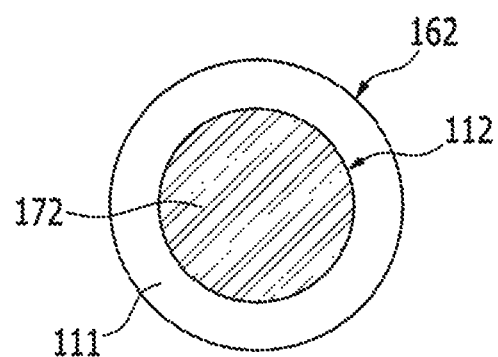
FIG. 2 to FIG. 5 are schematic top plan views with each showing a portion of one of the contact holes in the exemplary transistor array panel shown in FIG. 1, FIG. 6 to FIG. 16A and FIG. 17 are cross-sectional views sequentially showing process steps in a method of manufacturing a transistor array panel according to an exemplary embodiment of the invention.
Figure 4:
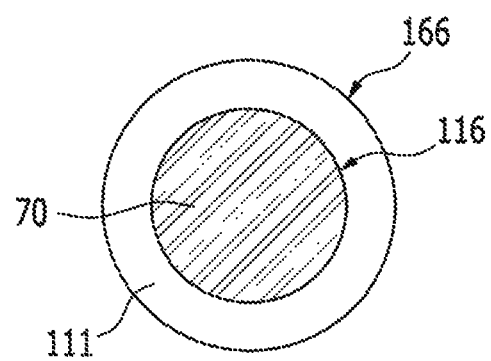

Referring to FIG. 1, FIG. 2, and FIG. 4, in the depicted embodiment(s) the buffer layer 111 includes a contact hole 112 corresponding to the contact hole 162 of the intermediate insulating layer 160 and a contact hole 116 corresponding to the contact hole 166 of the intermediate insulating layer 160.

The contact hole 112 is positioned under the contact hole 162 of the intermediate insulating layer 160 in the cross-sectional structure, is positioned in the contact hole 162 of the intermediate insulating layer 160 in the plan structure, and has a smaller size than the contact hole 162.

The contact hole 116 is positioned under the contact hole 166 of the intermediate insulating layer 160 in the cross-sectional structure, is positioned in the contact hole 166 of the intermediate insulating layer 160 in the plan structure, and has a smaller size of the contact hole 166.

In the contact holes 112 and 116, the buffer layer 111 is removed. That is, in the depicted embodiment, contact holes 112 and 116 pass entirely through the buffer layer 111 to expose layer 172.

In an alternative embodiment, the contact holes 162 and 166 of the intermediate insulating layer 160 may extend below a top surface of the buffer layer 111. That is, in this embodiment only part of the buffer layer 111 positioned between the edge of the contact hole 112 and 116 of the buffer layer 111 and the edge of the contact hole 162 and 166 of the intermediate insulating layer 160 may be removed.

As depicted in, for example, FIG. 1, the cross section (size of the hole in a plan view, or "plan size") of the contact holes 112 and 116 of the buffer layer 111 is smaller than the cross section (plan size) of the contact holes 162 and 166 of the intermediate insulating layer 160, respectively, corresponding to the contact holes 112 and 116. In the embodiment of FIG. 1, the intersection between holes 112 and 162, and holes 116 and 166, is in the form of a shoulder S disposed at the intersection between the side walls defining a larger width (e.g., diameter) of the upper holes 162, 166 and the side walls defining a smaller width (e.g., diameter) of the lower holes 112, 116. The side wall of the upper hole, the shoulder and the side walls of the lower hole together define a stepped shape, as shown best in the enlarged view of FIGS. [proposed new figures] In alternative embodiments, the plan size of the contact holes 112 and 116 of the buffer layer 111 may be similar to a plan size of the contact holes 162 and 166 of the intermediate insulating layer 160 respectively. That is, some exemplary embodiments may have no shoulder between the respective holes. Thus, in various exemplary embodiments, any given contact hole might not have a stepped shape. Accordingly, in these exemplary embodiments the side surfaces of the contact holes 112, 116 and the contact hole 162, 166 form contiguous, generally flat surfaces having a constant slope. Further, in various exemplary embodiments lacking a shoulder, there is a junction where a first substantially constant slope of the side surfaces of contact hole 162, 166 changes to a second substantially constant slope of side surfaces of contact hole 112, 116, the second substantially constant slope having a value different than a value of the first constant slope. Still further, in other various exemplary embodiments lacking a shoulder, the slope of side surfaces of contact hole 112, 116 is the same as the slope of side surfaces of contact hole 162, 166, such that the respective side surfaces form a single substantially straight line in a cross-sectional view thereof. These and other embodiments of the contact holes are described in detail later related to the drawings.

Figure 3:
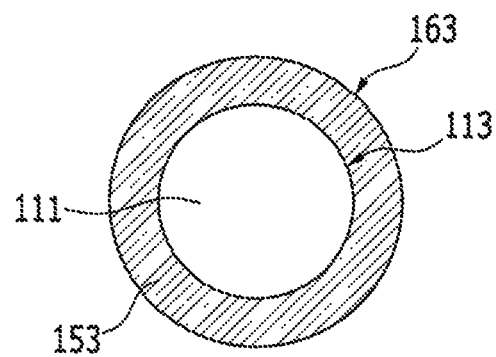
Figure 5:
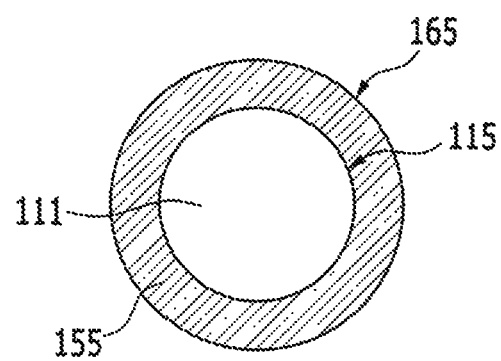

Referring to FIG. 1, FIG. 3, and FIG. 5, the semiconductor layer 152 includes a contact hole 113 corresponding to the contact hole 163 of the intermediate insulating layer 160 and a contact hole 115 corresponding to the contact hole 165 of the intermediate insulating layer 160. Thus, in various embodiments, at least part of the semiconductor layer 152 is removed in the contact holes 113 and 115. As shown in FIG. 1, in the contact holes 113 and 115, the semiconductor layer 152 may all be removed. In other words, in the embodiment depicted in FIG. 1, the contact holes 113 and 115 pass entirely through the semiconductor layer 152. In other embodiments, a part of the lower side of the semiconductor layer 152 may remain such that contact holes 113 and 115 do not pass entirely through the semiconductor layer 152.

The contact hole 113 is positioned under the contact hole 163 of the intermediate insulating layer 160 in the cross-sectional view of the structure of the embodiment depicted in FIG. 1, e.g., is positioned in the contact hole 163 of the intermediate insulating layer 160 in the plan view of the structure of the embodiment depicted in FIG. 2, e.g., and has a smaller size, i.e. diameter than the contact hole 163. Accordingly, the upper surface of the source region 153 around the contact hole 113 is not covered by the intermediate insulating layer 160.

In the depicted embodiment(s), the contact hole 115 is positioned under the contact hole 165 of the intermediate insulating layer 160 in the cross-sectional view of the structure, is positioned in the contact hole 165 of the intermediate insulating layer 160 in the plan view of the structure, and has a smaller size, i.e. diameter, than the contact hole 165 as depicted in FIG. 5. Accordingly, the upper surface of the drain region 155 around the contact hole 115 is not covered by the intermediate insulating layer 160.

In an exemplary embodiment of the contact holes 163 and 165, a width W1 of one side of the upper surface of the semiconductor layer 152 positioned around the contact holes 113 and 115 among the semiconductor layer 152 that is not covered by the intermediate insulating layer 160 may be about 0.5 µm or more. However width W1 is not limited to that value. Rather, width W1 may be appropriately controlled depending on the characteristics of the transistor TR.

The contact holes 113 and 115, in the embodiment shown in FIG. 1, extend to the inside of the buffer layer 111 such that at least part of the upper portion of the buffer layer 111 may be removed. In this case, in a view of the cross-sectional structure, a smallest cross-sectional thickness of the buffer layer 111 positioned under the contact holes 113 and 115 may be smaller than the smallest cross-sectional thickness of the buffer layer 111 that does not overlap the contact holes 113 and 115, for example the buffer layer 111 overlapping the channel region 154.

In the embodiment depicted in FIG. 1, e.g., the buffer layer 111 positioned under the contact holes 113 and 115 is not all removed such that the contact holes 113 and 115 do not reach all the way through the buffer layer 111 to the lower electrode 70.

In various embodiments that are different from FIG. 1, the contact holes 113 and 115 may only extend to the upper surface of the buffer layer 111, but may not extend to the inside of the buffer layer 111.

In various embodiments of the contact holes 113 and 115, an inner angle A between the side surface of the semiconductor layer 152 and the surface of the substrate 110 may be about 30° or more.

According to the exemplary embodiments, the contact holes 112, 113, 115, 116, 162, 163, 165, and 166 formed in the buffer layer 111, the intermediate insulating layer 160, and the semiconductor layer 152 are formed throughout the different layers from each other in the view of the cross-sectional structure, and two overlapping contact holes of the contact holes 112, 113, 115, 116, 162, 163, 165, and 166 entirely together form the side surface(s) of the step shape.

In the embodiment depicted in FIG. 1, each side wall (surface) of the contact holes 112, 113, 115, 116, 162, 163, 165, and 166 is obliquely inclined in the surface direction of the substrate 110 to define a tapered shape. For clarity, the side walls are those surfaces to which the distal end of the lead lines for reference numerals 112, 113, 115, 116, 162, 163, 165, 166 in FIG. 1 touch, as well as the symmetrically opposing surfaces. Further, and with reference to FIG. 2 through FIG. 5, it should be understood that, in various exemplary embodiments, including embodiments where the contact holes have a generally circular plan shape, the left and right opposing symmetrical surfaces of any given contact hole that appear to be discontinuous in the cross-sectional view of FIG. 1 are actually single contiguous surfaces. Also, in alternative embodiments, each side surface of the contact holes 112, 113, 115, 116, 162, 163, 165, and 166 may be substantially perpendicular to the surface direction of the substrate 110 (and, in various exemplary embodiments, thus also perpendicular to the surface direction of other layers as well). This concept of alternative geometries applies in following drawings. A tapered geometry may be perpendicular in alternative embodiments and a perpendicular geometry may be tapered in alternative embodiments.

In various embodiments, an upper conductive layer including a first connection part 173 and a second connection part 175 is formed on the intermediate insulating layer 160.

The first connection part 173 may be in contact with the upper surface of the lower conductor 172 through the contact holes 112 and 162 to be electrically connected therewith, and may likewise be in contact with the source region 153 through the contact holes 113 and 163 to be electrically connected therewith. The first connection part 173 may be in contact with the upper surface of the source region 153 in the contact hole 163 and may be in contact with the side surface of the source region 153 in the contact hole 113. The first connection part 173 may electrically connect the lower conductor 172 and the source region 153, and the source region 153 may be in contact with a voltage transmitted by the lower conductor 172 through the first connection part 173.

The second connection part 175 may be in contact with the upper surface of the lower electrode 70 through the contact holes 116 and 166 to be electrically connected therewith, and may likewise be in contact with the drain region 155 through the contact holes 115 and 165 to be electrically connected therewith. The second connection part 175 may be in contact with the upper surface of the drain region 155 in the contact hole 165 and may be in contact with the side surface of the drain region 155 in the contact hole 115. The second connection part 175 may electrically connect the lower electrode 70 and the drain region 155 to each other, and the lower electrode 70 may be electrically connected to the drain region 155 to be applied with the voltage. Accordingly, in a voltage-current characteristic graph of an embodiment of the transistor TR, a current slope decreases in the saturation region such that a range of the region where the output current of the transistor TR is uniform may be widened. Accordingly, even if a change is generated in the voltage input to the source region 153 of the transistor TR, the output current of the transistor TR may be uniform such that the output saturation characteristic may be improved in various embodiments.

The first connection part 173 and the second connection part 175 may respectively be in contact with the buffer layer 111 in the contact holes 113 and 115.

Depending on the structure of the transistor array panel, in various embodiments one or more of the contact holes 112 and 162, the contact holes 116 and 166, the contact holes 113 and 163, and the contact holes 115 and 165 may be omitted.

In some embodiments that are different than the embodiment depicted in FIG. 1, the lower electrode 70 may be omitted. In some such embodiments, the contact holes 166 and 116 may be omitted and the second connection part 175 isn't connected to the lower electrode 70.

Next, a manufacturing method of the transistor array panel according to an exemplary embodiment will be described with reference to FIG. 6 to FIG. 17 along with FIG. 1 to FIG. 5.

Figure 6:
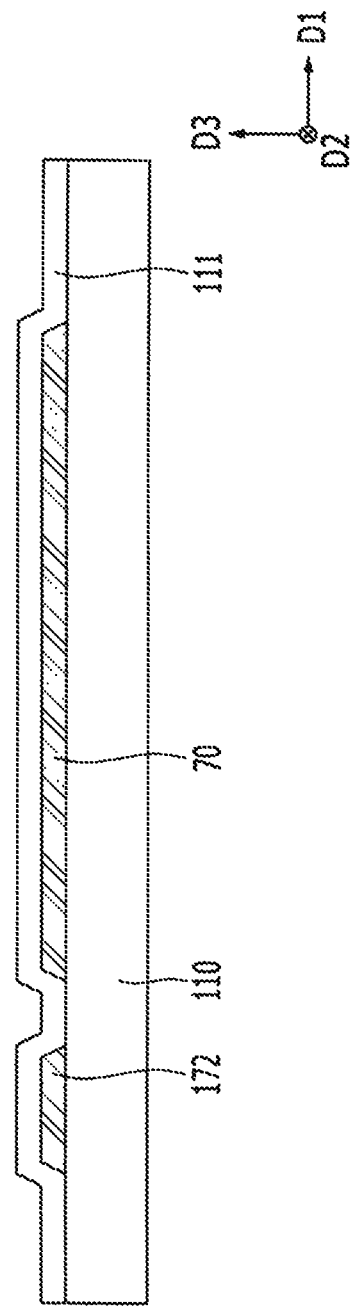

First, referring to FIG. 6, in various embodiments, a conductive material is deposited on a substrate 110 including an insulating material such as glass or plastic and patterned by a method such as photolithography to form a lower conductive layer including a lower electrode 70 and a lower conductor 172. Next, an insulating material may be deposited on the substrate 110 and the lower conductive layer to form a buffer layer 111 as depicted.

Figure 7:
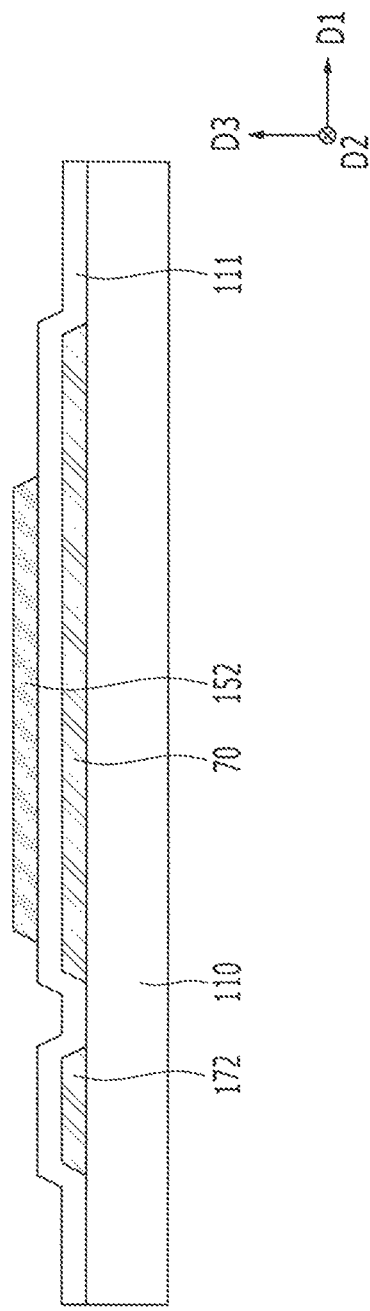

Next, referring to FIG. 7, in various embodiments a semiconductor material such as a metal oxide semiconductor is deposited on the buffer layer 111 and is patterned to form a semiconductor layer 152.

Figure 8:
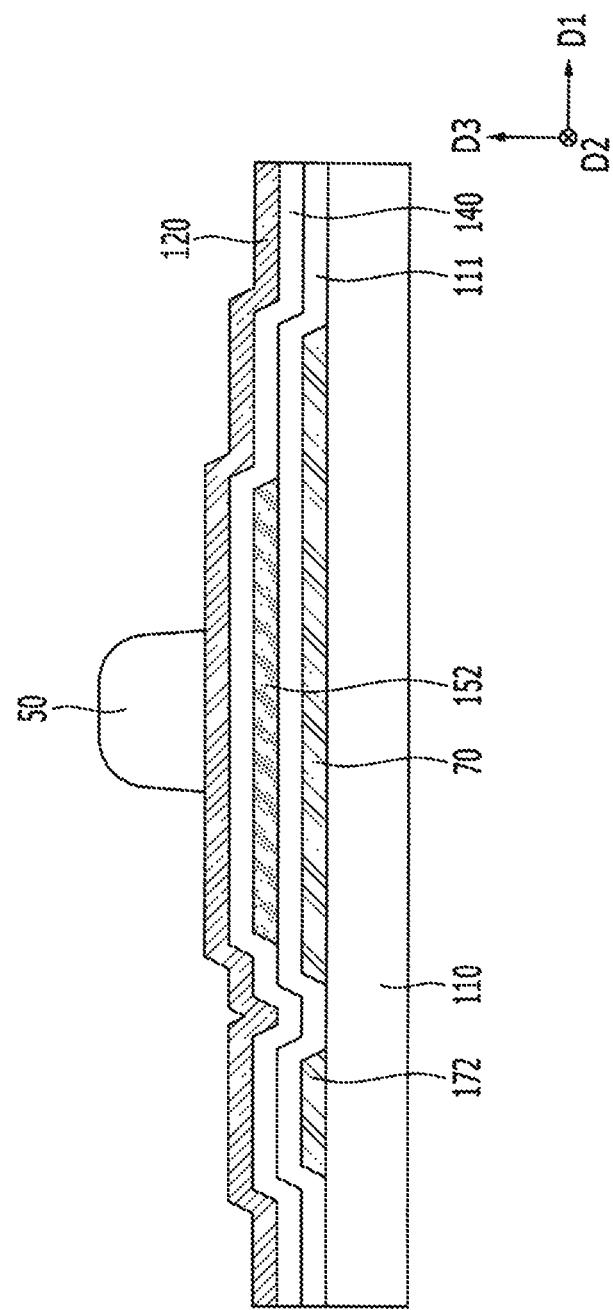

Next, referring to FIG. 8, an insulating material may be deposited on the substrate 110 formed with the semiconductor layer 152 to form an initial insulating layer 140 as depicted. Next, the conductive material such as the metal may be deposited on the initial insulating layer 140 to form a conductive layer 120 as depicted.

Next, in various embodiments, a mask pattern 50 is formed on the conductive layer 120. The mask pattern 50 may be formed through an exposure process using a photomask after coating a photosensitive film such as a photoresist. The mask pattern 50 includes a portion overlapping the semiconductor layer 152.

Figure 9:
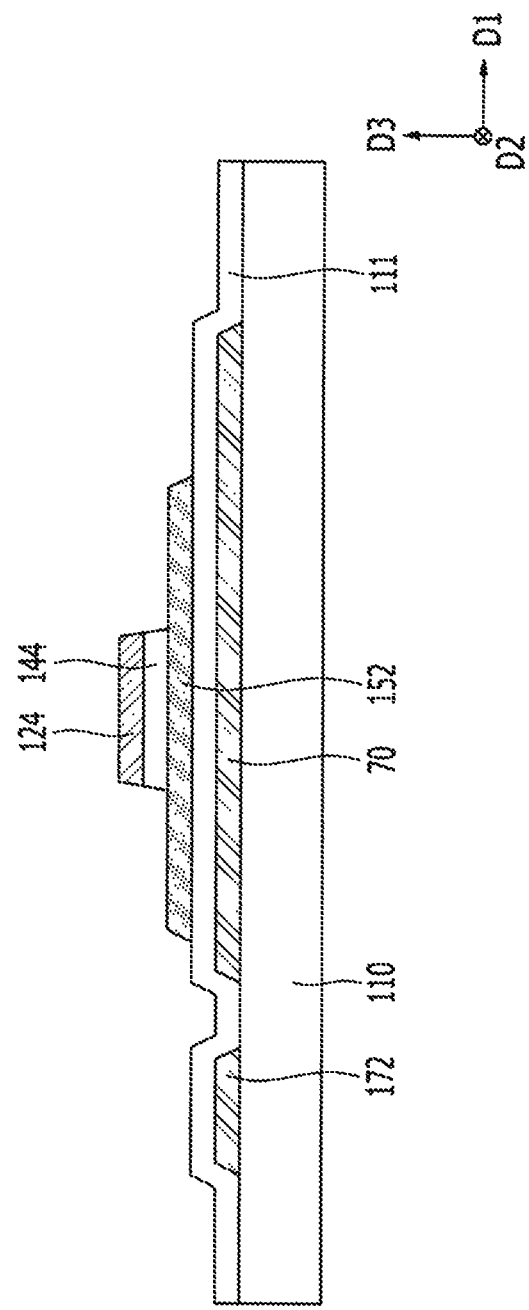

Next, referring to FIG. 8 and FIG. 9, the conductive layer 120 may be etched by using the mask pattern 50 as a mask to form an upper electrode 124 as depicted. Next, the initial insulating layer 140 may be etched by using the mask pattern 50 and the upper electrode 124 as a mask to form an insulating layer 144. Although not shown, part of the buffer layer 111 may also be etched in the etching process of the initial insulating layer 140 in various embodiments.

Figure 10:
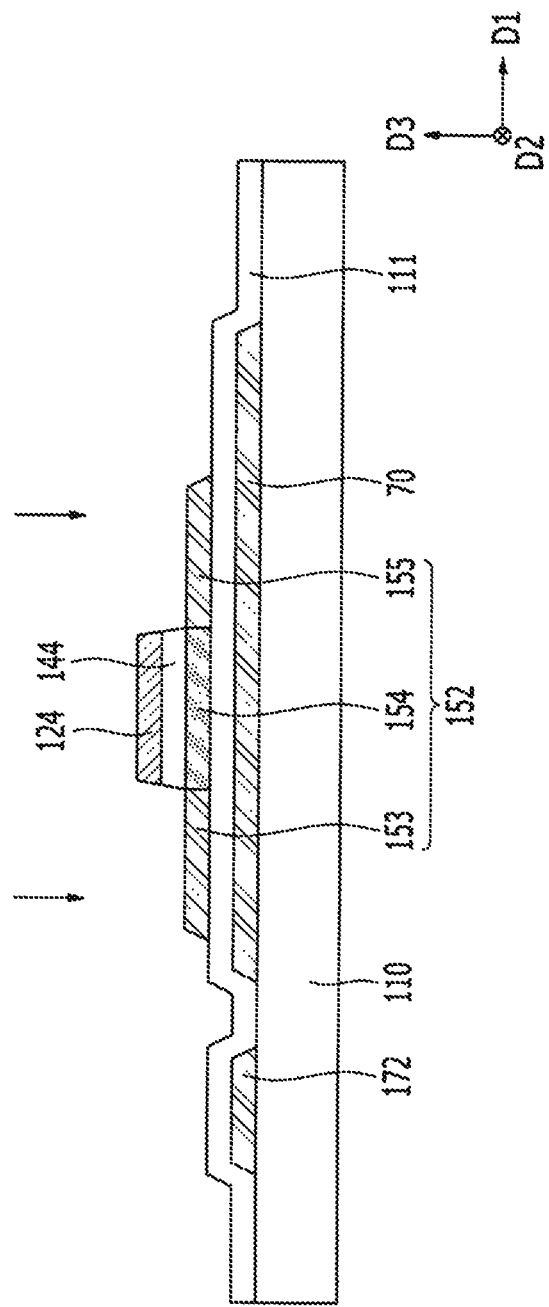

Next, referring to FIG. 10, in various embodiments the semiconductor layer 152 that is not covered by the insulating layer 144 and is exposed is processed to form a source region 153 and a drain region 155. In some such embodiments, the processing method may use a heat treatment method in a reduction atmosphere, or a plasma process method using a gas plasma such as hydrogen (H2), helium (He), phosphine (PH3), ammonia (NH3), silane (SiH4), methane (CH4), acetylene (C2H2), diborane (B2H6), carbon dioxide (CO2), germane (GeH4), hydrogen selenide (H2Se), hydrogen sulfide (H2S), argon (Ar), nitrogen (N2), nitrous oxide (N2O), or fluoroform (CHF3). The semiconductor layer 152 covered by the gate insulator 144 mainly maintains the semiconductor property, thereby being the semiconductor 154.

Figure 11:
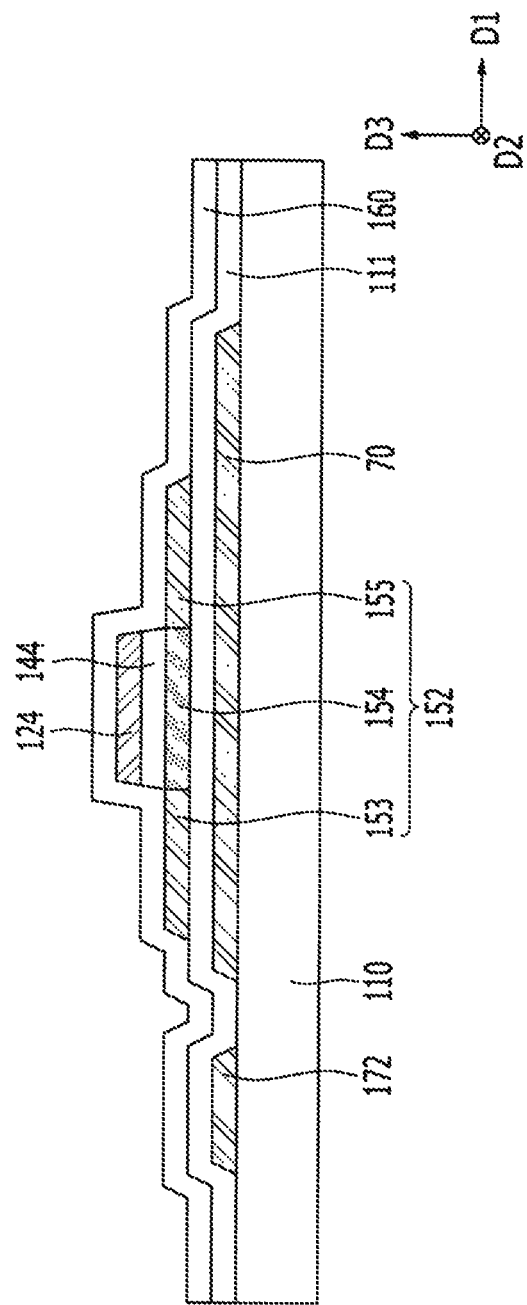

Next, referring to FIG. 11, in various embodiments, the insulating material is deposited on the substrate 110 to form an intermediate insulating layer 160.

Figure 12:
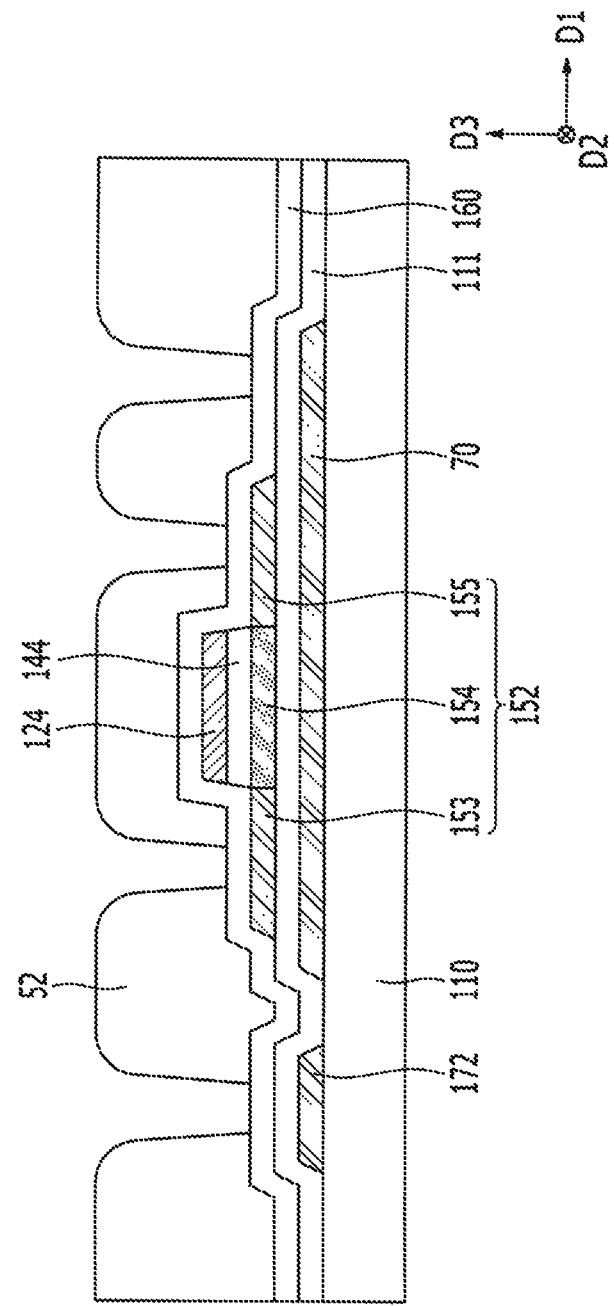

Next, referring to FIG. 12, the photosensitive film such as the photoresist may be coated on the intermediate insulating layer 160 and patterned through the exposure process using the photomask to form a mask pattern 52 as depicted. The mask pattern 52 may include openings respectively positioned on the lower conductor 172, the lower electrode 70, the source region 153, and the drain region 155.

Figure 13:
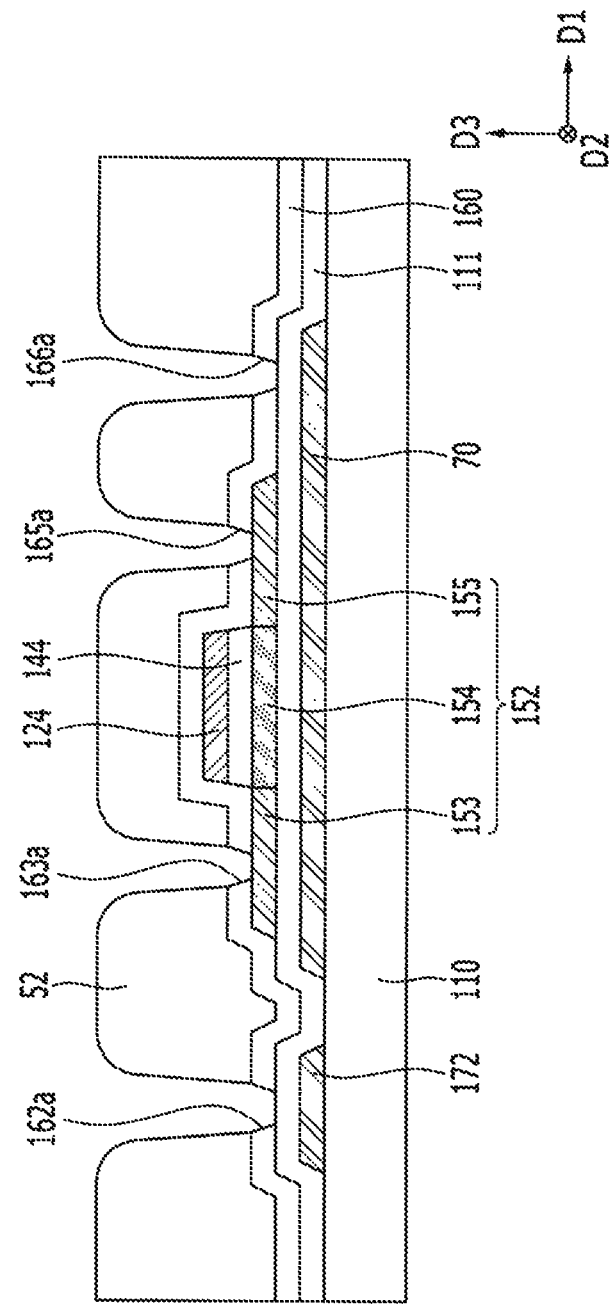

Next, referring to FIG. 13, in various embodiments the intermediate insulating layer 160 is etched by using the mask pattern 52 as a mask to form a hole 162a positioned on the lower conductor 172, a hole 166a positioned on the lower electrode 70, a hole 163a positioned on the source region 153, and a hole 165a positioned on the drain region 155. Accordingly, the buffer layer 111, the source region 153, and the drain region 155 are exposed. In some such embodiments, a dry etching method may be used.

Figure 14:
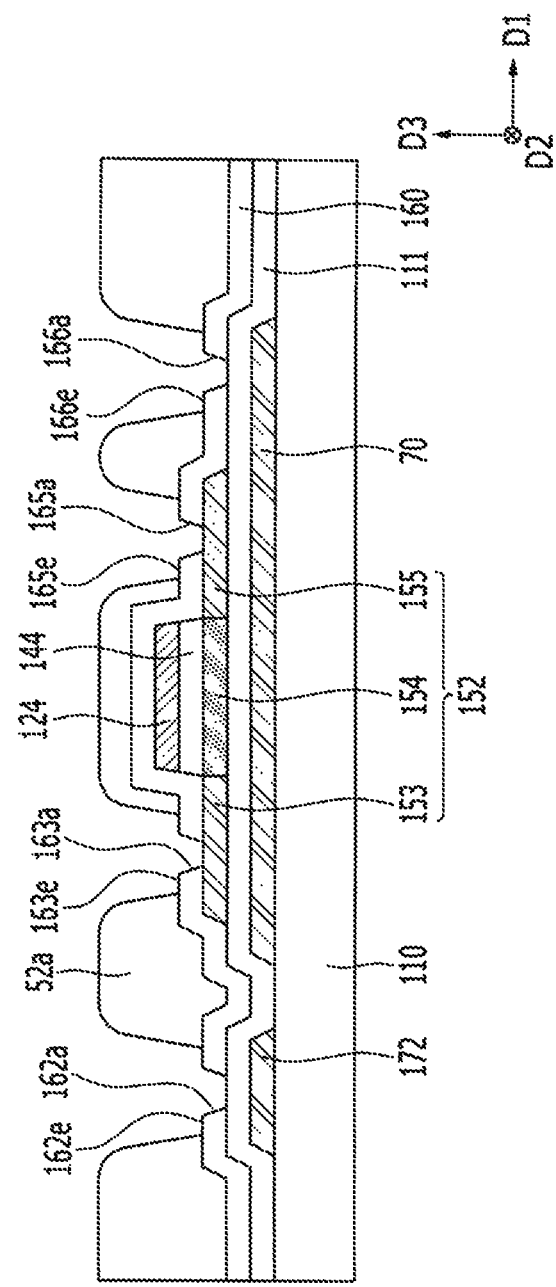
Figure 15:
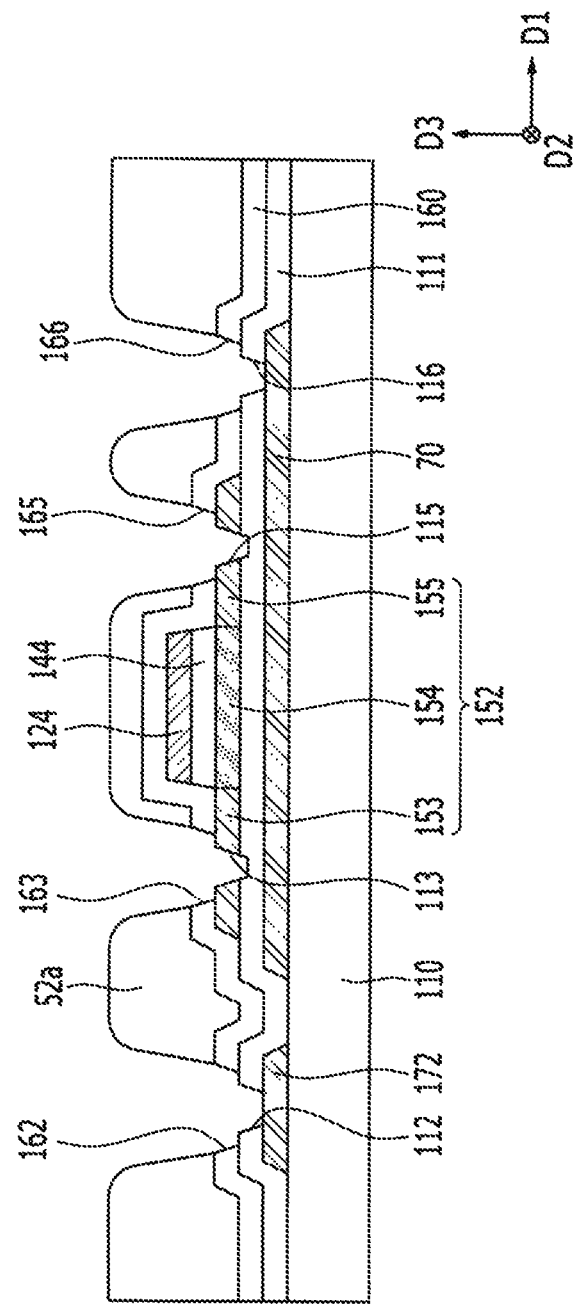

Next, referring to FIG. 14, the mask pattern 52 may be partially removed by a method such as ashing to form a reduced mask pattern (a reduced photosensitive pattern) 52a as depicted in FIG. 15. The ashing may use an oxygen-based gas. Thus, the cross-sectional thickness of the mask pattern 52 is reduced and the plan area of the openings of the mask pattern 52 is widened or expanded. Accordingly, a portion of the upper surface of the intermediate insulating layer 160 that is positioned around the holes 162a, 163a, 165a, and 166a of the intermediate insulating layer 160 is exposed. This exposed portion of the upper surface of the interlayer insulating later 160 that is exposed by ashing the mask pattern 52 is indicated, respectively, at 162e, 163e, 165e and 166e.

Next, referring to FIG. 15, in various embodiments, the part that is not covered by the reduced mask pattern 52a, that is, the part that is exposed, is etched by using the reduced mask pattern 52a as an etching mask. In some such embodiments, the etching degree may be appropriately controlled, and while the lower conductor 172 and the lower electrode 70 are not covered by the mask pattern 52a, the etching may be performed for the semiconductor layer 152 that is not covered by the reduced mask pattern 52a such that the etching process does not pass entirely through the semiconductor layer 152 and the lower electrode 70 positioned under the semiconductor layer 152 is not exposed.

Accordingly, in various embodiments, the buffer layer 111 positioned under the holes 162a and 166a of the intermediate insulating layer 160 is etched to form contact holes 112 and 116 exposing the lower conductor 172 and the lower electrode 70 in the buffer layer 111, and at least part of the semiconductor layer 152 positioned under the holes 163a and 165a of the intermediate insulating layer 160 is etched to form contact holes 113 and 115 in the semiconductor layer 152. The semiconductor layer 152 may all be removed, that is, etched entirely through; but, alternatively, at least part of the semiconductor layer 152 may also remain in the contact holes 113 and 115. Whether the semiconductor layer is etched entirely through depends on an etch rate or selectivity of an etching gas used in this exemplary portion of the etching process for the buffer layer 111 and the semiconductor layer 152.

The intermediate insulating layer 160 that is not covered by the reduced mask pattern 52a and is exposed may also be etched along with the buffer layer 111 and the semiconductor layer 152. Accordingly, contact holes 162 and 166 exposing the buffer layer 111 around the contact holes 112 and 116 of the buffer layer 111 and contact holes 163 and 165 exposing the semiconductor layer 152 around the contact holes 113 and 115 of the semiconductor layer 152 may be formed in the intermediate insulating layer 160 as depicted. In the contact holes 163 and 165, among the semiconductor layer 152 that is not covered by the intermediate insulating layer 160, one side width W1 (see FIG. 1) of the upper surface of the semiconductor layer 152 positioned around the contact holes 113 and 115 may, in various exemplary embodiments, be about 0.5 μm or more. However, in other embodiments the value of W1 is different. The width W1 of the upper surface of the semiconductor layer 152 may be controlled by controlling an amount of the mask pattern 52 removed in the process of forming the reduced mask pattern 52a through the removal of the mask pattern 52 by the ashing and the like.

Accordingly, the contact holes 112 and 162 exposing the lower conductor 172, the contact holes 116 and 166 exposing the lower electrode 70, the contact holes 113 and 163 exposing the upper surface and the side surface of the source region 153, and the contact holes 115 and 165 exposing the upper surface and the side surface of the drain region 155 are formed in various exemplary embodiments. As the terms are used herein, references to the upper surface of the source region 153 and the drain region 155 mean a surface approximately parallel to a surface direction of the substrate 110, and references to the side surface mean a surface parallel to a direction different from the surface direction of the substrate 110.

The contact holes 113 and 115 of the semiconductor layer 152, as shown in FIG. 15, may, in some embodiments, extend into at least part of the upper portion of the buffer layer 111 or may, in other embodiments, not extend to the buffer layer 111.

Alternatively, at least part of the buffer layer 111 positioned around the contact holes 112 and 116 of the buffer layer 111 and exposed by the contact holes 162 and 166 of the intermediate insulating layer 160 may be removed. Accordingly, the contact holes 162 and 166 of the intermediate insulating layer 160 may be formed to extend to the inside of the buffer layer 111. Furthermore, the contact holes 162 and 166 of the intermediate insulating layer 160 may be connected while forming the flat side surface with the contact holes 112 and 116 of the buffer layer 111 without forming the step shape. Thus, in some embodiments, by the contact holes 163 and 165 of the intermediate insulating layer 160, the upper surface of the semiconductor layer 152 may be exposed in, for example, a step shape, or in some other embodiments, only the side surface of the semiconductor layer 152, but not a top surface thereof, is exposed. In the contact holes 162, 163, 165, and 166 of the intermediate insulating layer 160, the etching degree of the buffer layer 111 and the semiconductor layer 152 may be different depending on the etch rate or the selectivity of the etching gas used for the buffer layer 111 and the semiconductor layer 152.

In various exemplary embodiments, such as embodiments having the contact hole exposing the lower conductive layer including the lower electrode 70 and the lower conductor 172 and embodiments having the contact hole exposing the semiconductor layer 152, the contact holes being connected to the constituent elements positioned at the various layers and having the various depths may be formed by using one mask pattern 52 formed through one photomask. Accordingly, the manufacturing cost and the manufacturing time of the transistor array panel may be reduced and the manufacturing process may be simplified, particularly with respect to processes that use plural photomasks.

Also, it is not necessary to use the etching gas with the high selectivity for the buffer layer 111 and the semiconductor layer 152 such that the difficulty of the process may be reduced, particularly as compared to processes where the etching gas must be selected to have a particular high selectivity according the materials used to formulate the various elements of the transistor/panel.

Also, forming contact holes according the principles of the invention facilitates easy control of the semiconductor layer 152 remaining in contact with the other layers, thereby increasing the process margin, and improving the characteristics of the transistor TR. Particularly, the initial thickness of the semiconductor layer 152 may be substantially maintained and the margin for reducing the cross-sectional thickness of the semiconductor layer 152 increased.

Figure 16A:
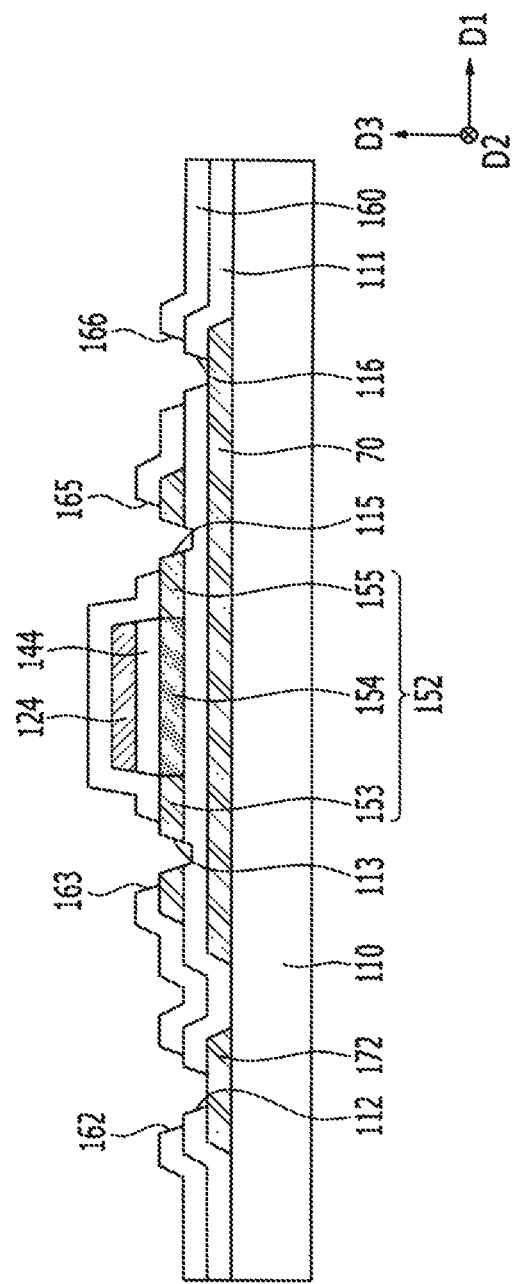
FIG. 16B is an enlarged portion of detail shown in FIG. 16A.
Figure 17:
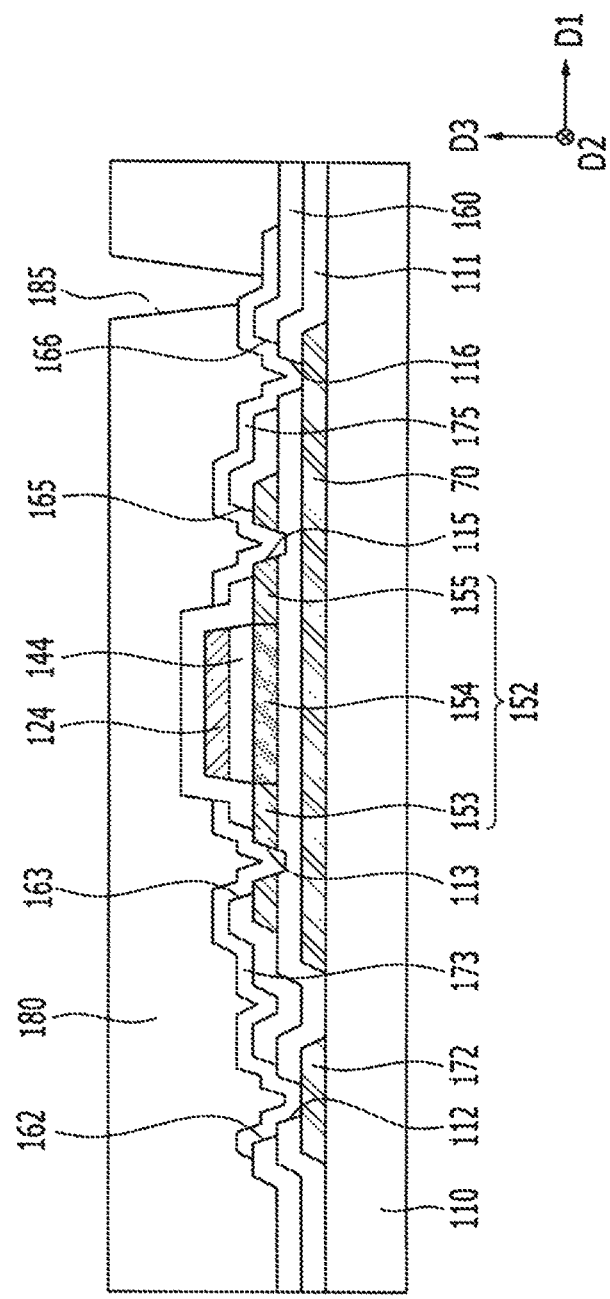

Next, referring to FIG. 16A and FIG. 1, in various exemplary embodiments, the reduced mask pattern 52a is removed and the conductive layer is deposited on the intermediate insulating layer 160 and is patterned to form an upper conductive layer including a first connection part 173 and a second connection part 175 (see also FIG. 17).

Figure 16B:
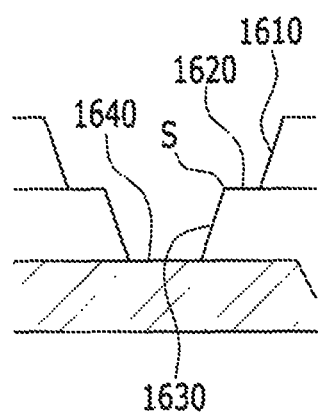

FIG. 16B shows enlarged detail of an exemplary contact hole from FIG. 16A, including a first side surface 1610 defining a first width, e.g, diameter of a first portion of the hole, a second side surface 1630 defining a second width, e.g., diameter, of a second portion of the hole and a bottom 1640. The second width preferably is smaller than the first width in this embodiment. A shoulder S is formed by a generally horizontally planar surface 1620 connecting the first side surface 1610 and the second side surface 1630. In other embodiments, such as shown in FIGS. 31B, 31C, and 33B the first and second widths are substantially equal in which case the shoulder S is eliminated, or, in the case of the embodiment of FIG. 31B, moved to a lower location. In the embodiment of FIG. 33B, the slopes of the first and second side walls are different and meet at a junction (discontinuity) between the two widths, which does not form a shoulder. If the slopes are substantially the same, then the there will be no shoulder or junction between the sidewalls, which will form a substantially contiguous surface, such as shown in the upper two layers of the embodiment of FIG. 31B and as shown in the embodiment of FIG. 31C.

Next, referring to FIG. 17, the inorganic insulating material or the organic insulating material may be deposited on the upper conductive layer and may be patterned to form a passivation layer 180 including a contact hole 185 as depicted. The contact hole 185, for example, may be positioned on the second connection part 175 and exposes the second connection part 175. The upper surface of the passivation layer 180 may be substantially flat as depicted.

Next, the detailed structure of the transistor array panel according to an exemplary embodiment will be described with reference to FIG. 18 to FIG. 20 along with above-described FIG. 1 to FIG. 5.

Figure 18:
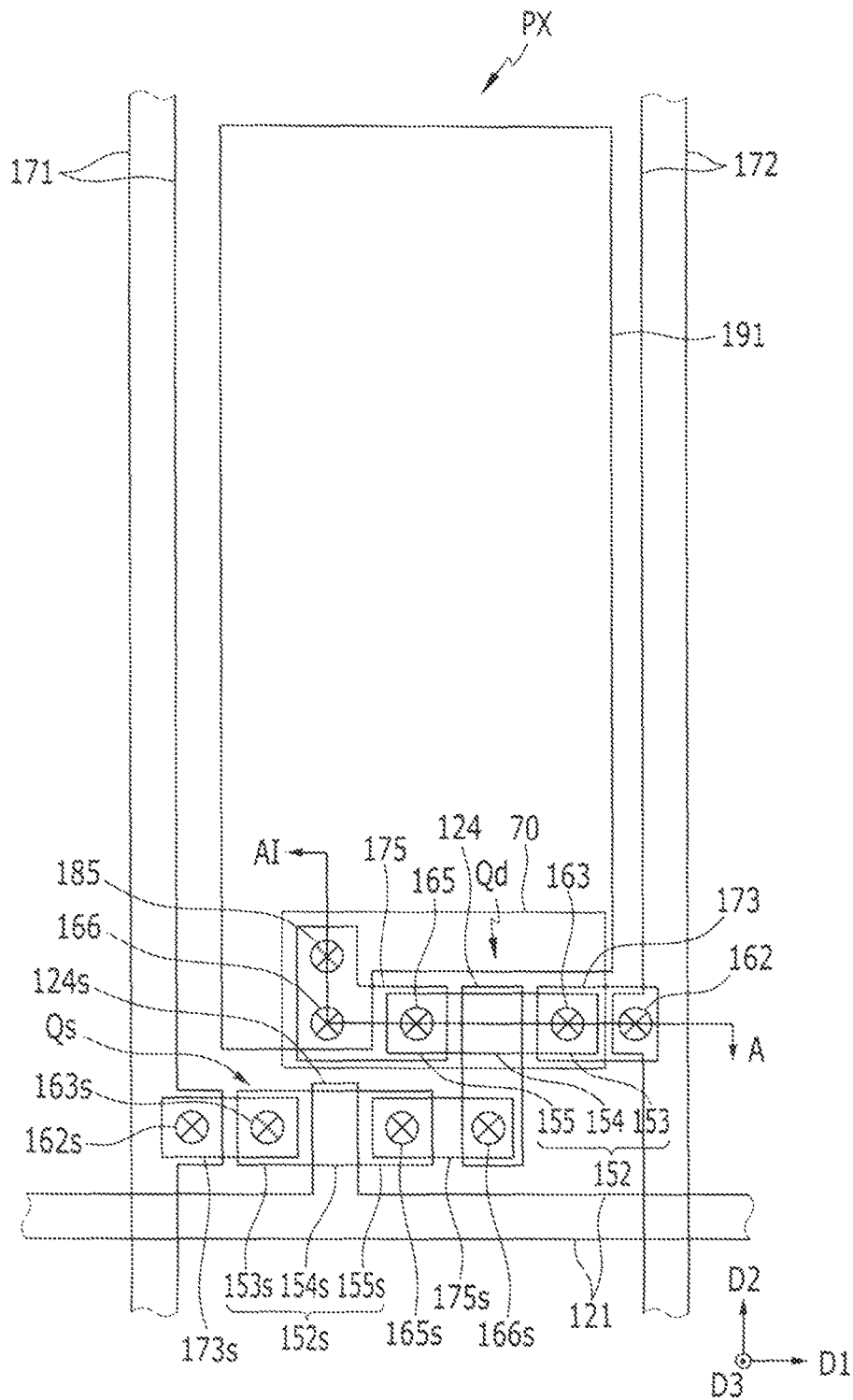
FIG. 18 is a partial layout view of a transistor array panel constructed according to another exemplary embodiment of the invention.
Figure 19:
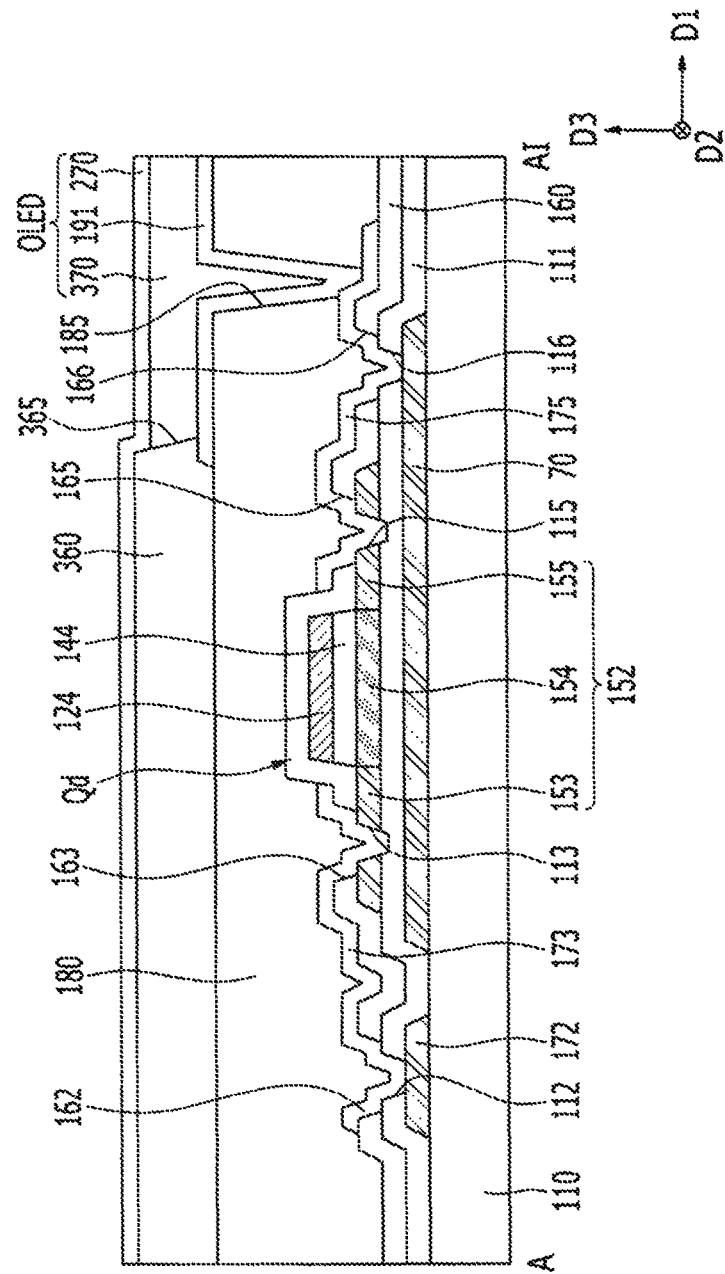
FIG. 19 is a cross-sectional view taken along a line A-AI of FIG. 18 showing one example of a portion of the transistor array panel of FIG. 18.

FIG. 18 is a partial layout view of a transistor array panel according to another exemplary embodiment of the invention, and FIG. 19 is a cross-sectional view taken along a line A-AI of FIG. 18 showing one example of a portion of the transistor array panel of FIG. 18.

Referring to FIG. 18 and FIG. 19, various exemplary embodiments of the transistor array panel are a display panel including a plurality of pixel PX, and signal lines including a gate line 121 transmitting a gate signal and a data line 171 transmitting a data signal, a switching transistor Qs including a switching semiconductor layer 152s and a switching gate electrode 124s, a switching source electrode 173s, a switching drain electrode 175s, and a driving transistor Qd. In various embodiments, the foregoing components may be positioned on a substrate 110.

The structure of the driving transistor Qd may be the same as the structure of the transistor TR of the above-described exemplary embodiment(s). As such, a more detailed description is omitted as otherwise unnecessarily repetitive.

The gate line 121 may include a part mainly extending in the first direction D1, and the data line 171 may include a part mainly extending in the second direction D2. The gate line 121 may be positioned at the same layer as the upper electrode 124, and the data line 171 may be positioned at the same layer as the lower conductor 172. The lower conductor 172 according to various exemplary embodiments where it is a signal line transmitting a driving voltage may extend to be mainly elongated in the second direction D2 like the data line 171.

In various exemplary embodiments, the switching semiconductor layer 152s includes a channel region 154s in which the channel of the switching transistor Qs may be formed, and a switching source region 153s and a switching drain region 155s respectively positioned at both sides of the channel region 154s. The switching semiconductor layer 152s, for example, may include a metal oxide, polysilicon, or amorphous silicon, and may be positioned at the same layer as the semiconductor layer 152 of the transistor Qd, but it is not limited to such configurations.

The carrier concentration of the switching source region 153s and the switching drain region 155s may be larger than the carrier concentration of the switching channel region 154s, and the switching source region 153s and the switching drain region 155s are conductive.

In various exemplary embodiments, the switching gate electrode 124s overlaps the channel region 154s of the switching semiconductor layer 152s via an insulating layer (not shown). The switching gate electrode 124s may be connected with the gate line 121 as depicted, thereby receiving the gate signal. The switching gate electrode 124s may be positioned at the same layer as the gate line 121.

The intermediate insulating layer 160 may further include a contact hole 163s positioned on the switching source region 153s, a contact hole 165s positioned on the switching drain region 155s, a contact hole 162s positioned on the data line 171, and a contact hole 166s positioned on the upper electrode 124 as depicted.

The switching source electrode 173s and the switching drain electrode 175s may be positioned at the same layer as the first connection part 173 and the second connection part 175 as according to the various such embodiments described above. The switching source electrode 173s may electrically connect the data line 171 and the switching source region 153s of the switching transistor Qs to each other through the contact holes 162s and 163s, and the switching drain electrode 175s may electrically connect the switching drain region 155s of the switching transistor Qs and the upper electrode 124 of the driving transistor Qd through the contact holes 165s and 166s.

In various exemplary embodiments, the upper electrode 124 of the driving transistor Qd may be applied with the voltage transmitted from the switching drain region 155s of the switching transistor Qs. The first connection part 173 of the driving transistor Qd may be connected to the lower conductor 172 of the driving voltage to transmit the driving voltage to the driving transistor Qd.

Referring to FIG. 18 and FIG. 19, a passivation layer 180 including the insulating material may be positioned on the first connection part 173, the second connection part 175, the switching source electrode 173s, and the switching drain electrode 175s as depicted. Accordingly, in various exemplary embodiments, the passivation layer 180 includes a contact hole 185 exposing the second connection part 175. The upper surface of the passivation layer 180 except for the contact hole 185 may be substantially flat.

A pixel electrode 191 may be positioned on the passivation layer 180. The pixel electrode 191 may be connected to the second connection part 175 and the drain region 155 of the driving transistor Qd through the contact hole 185, thereby receiving the voltage.

A pixel definition layer 360 may be positioned on the pixel electrode 191 and the passivation layer 180. The pixel definition layer 360 includes an opening 365 positioned on the pixel electrode 191. In the opening 365 of the pixel definition layer 360, an emission layer 370 may be positioned on the pixel electrode 191 and a common electrode 270 may be positioned on the emission layer 370 as depicted. The common electrode 270 may be applied with a common voltage. The pixel electrode 191, the emission layer 370, and the common electrode 270 together form an organic light emitting diode (OLED).

The structure of the layers positioned on the pixel electrode 191 is not limited to the structure shown in the Figures. Rather, that structure may be variously changed depending on a kind of the display device.

Figure 20:
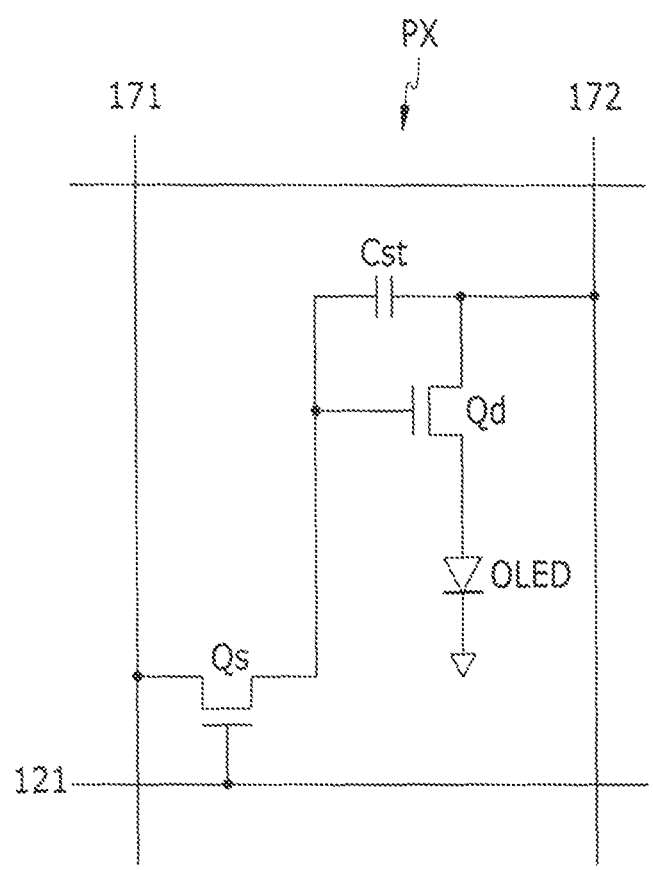
FIG. 20 is a schematic circuit diagram of one pixel of a transistor array panel according to the exemplary embodiment shown in FIG. 18 and FIG. 19.

An equivalent circuit for one pixel PX of the transistor array panel according to the exemplary embodiment shown in FIG. 18 and FIG. 19 is shown in FIG. 20. Referring to FIG. 20, one pixel PX includes a switching transistor Qs, a driving transistor Qd, a capacitor Cst, and an organic light emitting diode (OLED).

In the depicted embodiment, the switching transistor Qs includes a control terminal connected to the gate line 121, an input terminal connected to the data line 171, and an output terminal connected to a control terminal of the driving transistor Qd. The switching transistor Qs transmits the data signal transmitted from the data line 171 to the control terminal of the driving transistor Qd in response to the gate signal transmitted from the gate line 121.

The driving transistor Qd includes an input terminal connected to the lower conductor 172 transmitting the driving voltage and an output terminal connected to the organic light emitting diode (OLED). The driving thin film transistor Qd outputs a current that has a varying magnitude depending on a voltage applied between the control terminal and the output terminal.

In the depicted embodiment, the capacitor Cst is connected between the control terminal and the input terminal of the driving transistor Qd, charges the data signal applied to the control terminal of the driving transistor Qd, and maintains the data signal after the switching transistor Qs is turned off The organic light emitting diode (OLED) displays an image by changing intensity thereof depending on the output current of the driving transistor Qd.

The switching transistor Qs and the driving transistor Qd may be an n-type transistor, however at least one may be a p-type transistor. The channel type of the switching transistor Qs and the driving transistor Qd may be the same or different.

Next, the detailed structure of the transistor array panel according to an exemplary embodiment will be described with reference to FIG. 21 and FIG. 22 along with the above-described FIG. 1 to FIG. 5.

Figure 21:
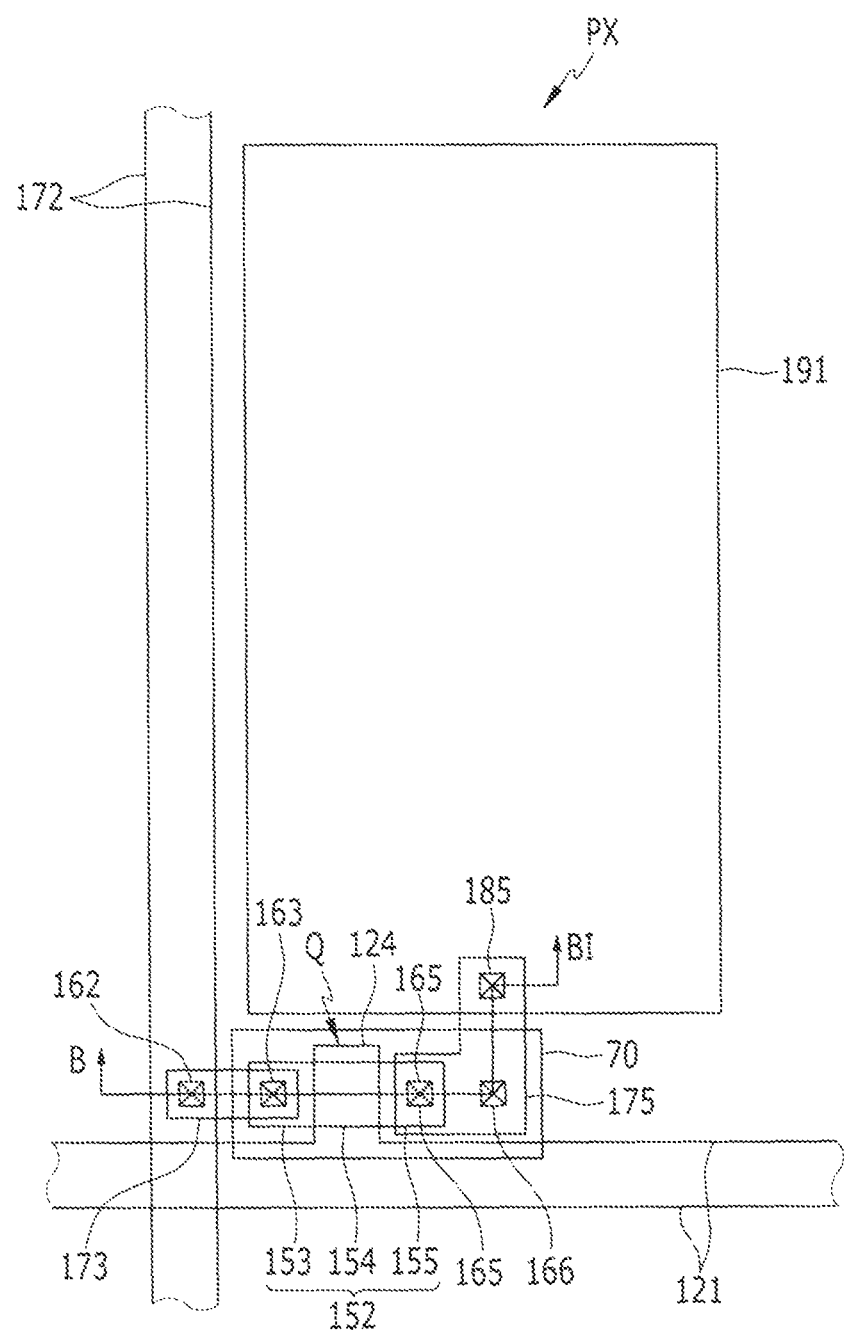
FIG. 21 is a partial layout view of a transistor array panel according to another exemplary embodiment of the invention.
Figure 22:
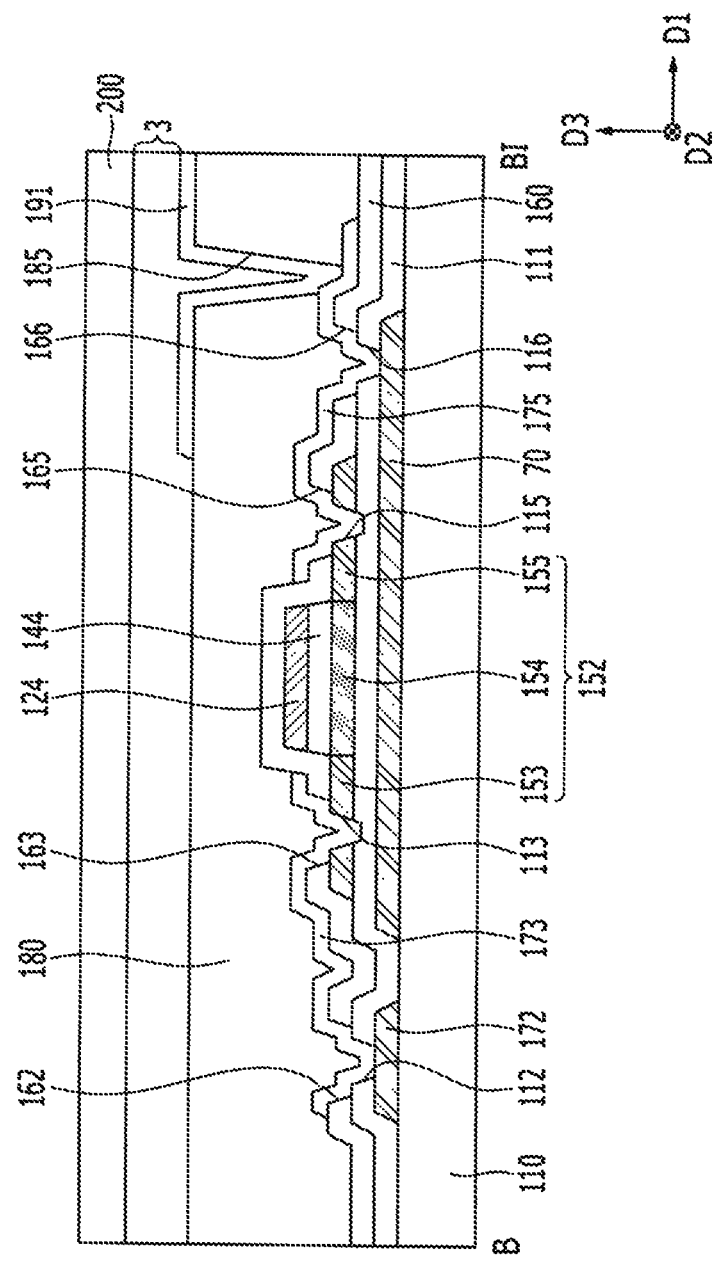
FIG. 22 is a cross-sectional view taken along a line B-BI of FIG. 21 showing one example of a portion of the transistor array panel of FIG. 21, FIG. 23 to FIG. 27 are cross-sectional views sequentially showing process steps of a method of manufacturing a transistor array panel according to another exemplary embodiment of the invention.

FIG. 21 is a partial layout view of a transistor array panel according to another exemplary embodiment of the invention, and FIG. 22 is a cross-sectional view taken along a line B-BI of FIG. 21 showing one example of a portion of the transistor array panel of FIG. 21.

Referring to FIG. 21 and FIG. 22, the transistor array panel according to various exemplary embodiments is the display panel including the plurality of pixels PX. The gate line 121 transmitting the gate signal and the transistor Q may be positioned on the substrate 110 as depicted.

The structure of the transistor Q is the same as the structure of exemplary embodiments of the transistor TR described above. Accordingly, a detailed description of the structure of the transistor Q is omitted as unnecessarily duplicative.

The gate line 121 may include the part mainly extending in the first direction D1 and may be connected to the upper electrode 124, and may be positioned with the same layer as the upper electrode 124 as depicted.

The lower conductor 172 may include the part mainly extending in the second direction D2 and may cross the gate line 121. The lower conductor 172 may be the data line transmitting the data voltage.

In various exemplary embodiments, the display panel is a panel of the liquid crystal display and has the same cross-section as most of the exemplary embodiments shown in the above-described FIG. 1 to FIG. 5, and the passivation layer 180 including the insulating material may be positioned on the first connection part 173 and the second connection part 175. As depicted, the passivation layer 180 includes a contact hole 185 exposing the second connection part 175. The upper surface of the passivation layer 180 except for the contact hole 185 may be substantially flat.

The pixel electrode 191 may be positioned on the passivation layer 180 as depicted. The pixel electrode 191 may be connected to the second connection part 175 and the drain region 155 of the transistor Q through the contact hole 185, thereby receiving the data voltage.

In various exemplary embodiments, a liquid crystal layer 3 including a plurality of liquid crystal molecules is positioned on the pixel electrode 191, and an upper layer 200 facing the pixel electrode 191 may be positioned on the liquid crystal layer 3. The upper layer 200 may include a separate substrate or an insulating layer that is different from the substrate 110. Also, the upper layer 200 may include a common electrode (not shown) generating an electric field to the liquid crystal layer 3 along with the pixel electrode 191. Alternatively, the common electrode may be positioned between the liquid crystal layer 3 and the transistor Q.

In various embodiments that are different than the embodiments shown in FIG. 21 and FIG. 22, the lower electrode 70 may be omitted, and in some such embodiments, the contact holes 166 and 116 may be omitted and the second connection part 175 is not connected to the lower electrode 70.

Next, the manufacturing method of the transistor array panel according to another exemplary embodiment of the invention will be described with reference to FIG. 23 to FIG. 27 along with FIG. 1 to FIG. 17.

The manufacturing method of the transistor array panel according to the exemplary embodiment of FIG. 23 to FIG. 27 is the same as most of the manufacturing method according to the exemplary embodiments described in FIG. 6 to FIG. 17, however the manufacturing method according to the exemplary embodiment of FIG. 23 to FIG. 27 is different with respect to the step of removing the intermediate insulating layer 160 by using the mask pattern 52 as the mask.

Figure 23:
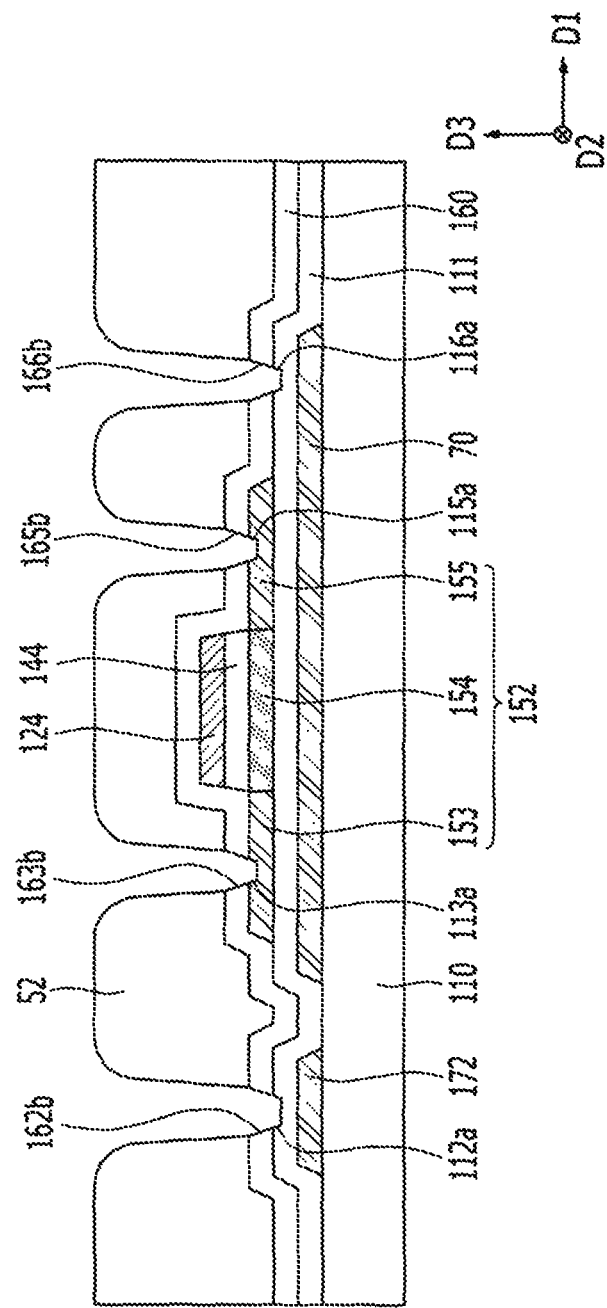

Referring to FIG. 23, in the depicted embodiment, the intermediate insulating layer 160 is removed by using the mask pattern 52 as the mask to form a hole 162b positioned on the lower conductor 172, a hole 166b positioned on the lower electrode 70, a hole 163b positioned on the source region 153, and a hole 165b positioned on the drain region 155.

The holes 162b and 166b extend to the inside of the buffer layer 111 such that grooves 112a and 116a may be formed in the buffer layer 111 corresponding to the holes 162b and 166b in the depicted embodiment. That is, the part of the upper portion of the buffer layer 111 corresponding to the holes 162b and 166b may be removed as shown. Also, the holes 163b and 165b extend to the inside of the semiconductor layer 152 such that grooves 113a and 115a may be formed in the semiconductor layer 152 corresponding to the holes 163b and 165b. That is, the part of the upper portion of the semiconductor layer 152 corresponding to the holes 163b and 165b may be removed as shown.

Figure 24:
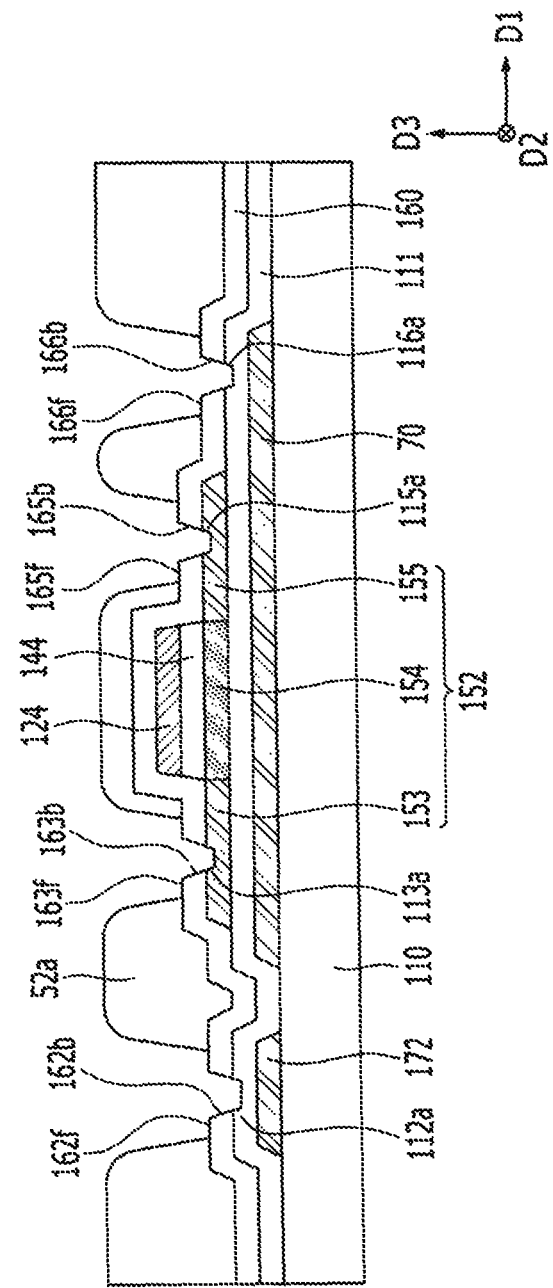

Next, referring to FIG. 24, in various exemplary embodiments, the mask pattern 52 is partially removed by the ashing to form the reduced mask pattern 52a. Accordingly, the upper surface of the intermediate insulating layer 160 positioned about the holes 162b, 163b, 165b, and 166b of the intermediate insulating layer 160 may be exposed as shown. This exposed portion of the upper surface of the interlayer insulating later 160 that is exposed by ashing the mask pattern 52 is indicated, respectively, at 162f, 163f, 165f and 166f.

Figure 25:
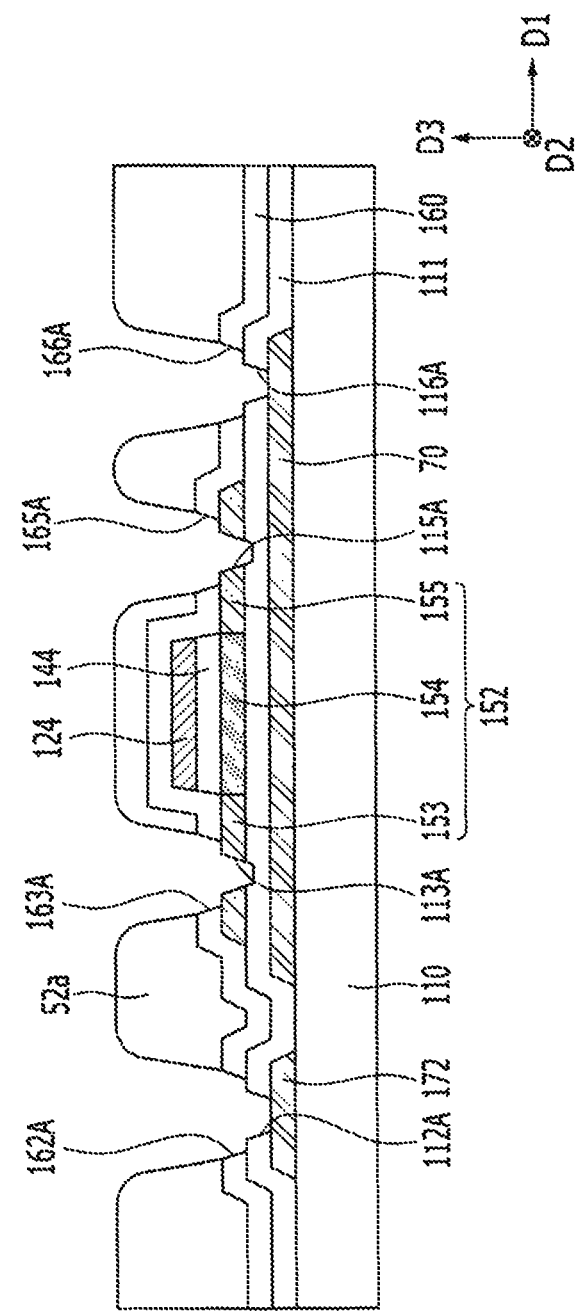

Next, referring to FIG. 25, the portion that is not covered by the reduced mask pattern 52a to be exposed may be etched by using the reduced mask pattern 52a as the mask. In various exemplary embodiments of such a step, contact holes 162A, 163A, 165A, and 166A of the intermediate insulating layer 160, contact holes 112A and 116A of the buffer layer 111, and contact holes 113A and 115A of the semiconductor layer 152 are formed. These contact holes 112A, 116A, 113A, 115A, 162A, 163A, 165A, and 166A are almost the same as the contact holes 112, 116, 113, 115, 162, 163, 165, and 166 according to the exemplary embodiments shown in FIG. 1 to FIG. 17, however the area and the size thereof may be different. For example, in various exemplary embodiments, the contact holes 113A and 115A of the semiconductor layer 152 extend to the inside of the buffer layer 111 to be formed with the groove in the buffer layer 111, and in some such embodiments, the depth of the groove of the buffer layer 111 may be deeper than in the exemplary embodiment shown in FIG. 15. That is, the depth of the contact holes 113A and 115A may be deeper than those of the exemplary embodiments described above. As the term is used herein, the depth means the length of the direction toward the substrate 110 in the cross-sectional structure, that is, the length in direction D3. The term depth is used in the same manner hereafter.

The plan area of at least some of the contact holes 112A, 116A, 113A, 115A, 162A, 163A, 165A, and 166A according to the present exemplary embodiment may be wider than each plan area of the contact holes 112, 116, 113, 115, 162, 163, 165, and 166, as, for example, is shown by the exemplary embodiment of FIG. 17.

In various exemplary embodiments, the contact holes 162A and 166A of the intermediate insulating layer 160 do not extend to the buffer layer 111, and are thus different than the embodiment shown, however, in embodiments where the contact holes 162A and 166A do not extend to the buffer layer 111, the part of the upper portion of the buffer layer 111 corresponding to the contact holes 162A and 166A of the intermediate insulating layer 160 may be etched such that the contact holes 162A and 166A of the intermediate insulating layer 160 may thereafter extend to the inside of the buffer layer 111. Likewise, in some embodiments, the contact holes 163A and 165A of the intermediate insulating layer 160 do not extend to the semiconductor layer 152, and are thus different than the embodiment shown, however, in these differing embodiments, the part of the upper portion of the semiconductor layer 152 corresponding to the contact holes 163A and 165A of the intermediate insulating layer 160 may be etched such that the contact holes 163A and 165A of the intermediate insulating layer 160 may thereafter extend to the inside of the semiconductor layer 152.

Figure 26:
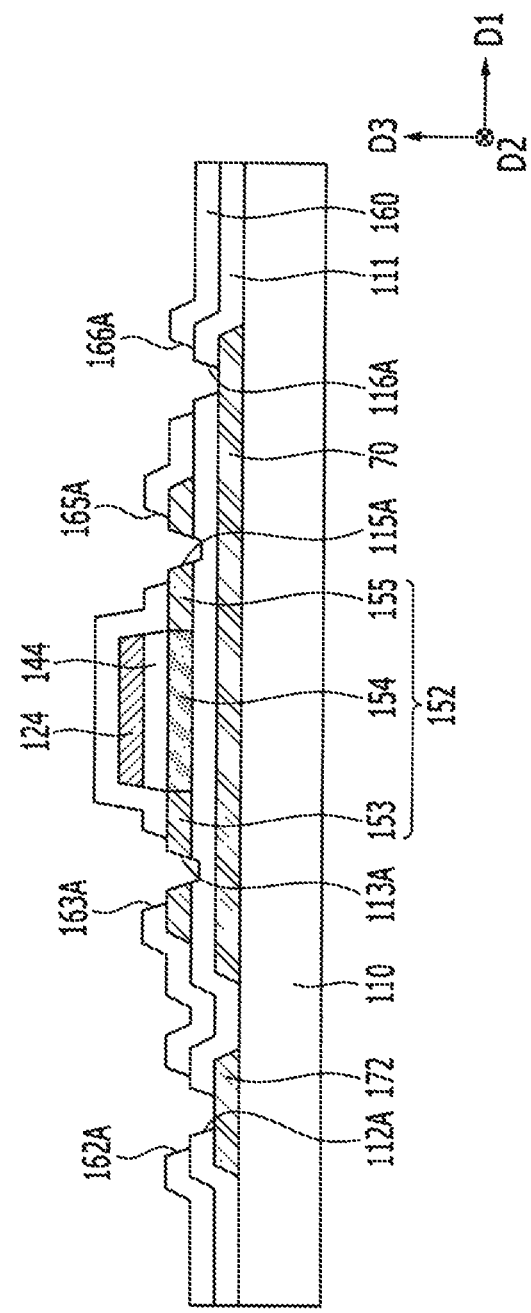

Next, referring to FIG. 26, the reduced mask pattern 52a may be removed as shown.

Figure 27:
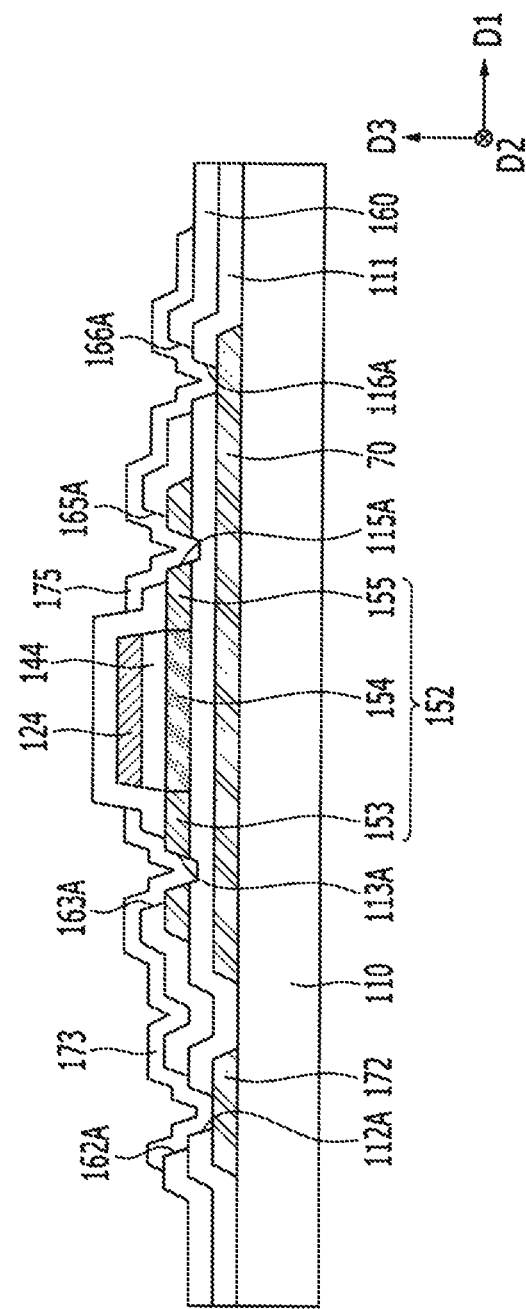

Next, referring to FIG. 27, in various exemplary embodiments, the conductive layer is deposited on the intermediate insulating layer 160 and patterned to form the upper conductive layer including the first connection part 173 and the second connection part 175.

Next, the manufacturing method of the transistor array panel according to an exemplary embodiment will be described with reference to FIG. 28 and FIG. 29 along with FIG. 23 to FIG. 27.

Figure 28:
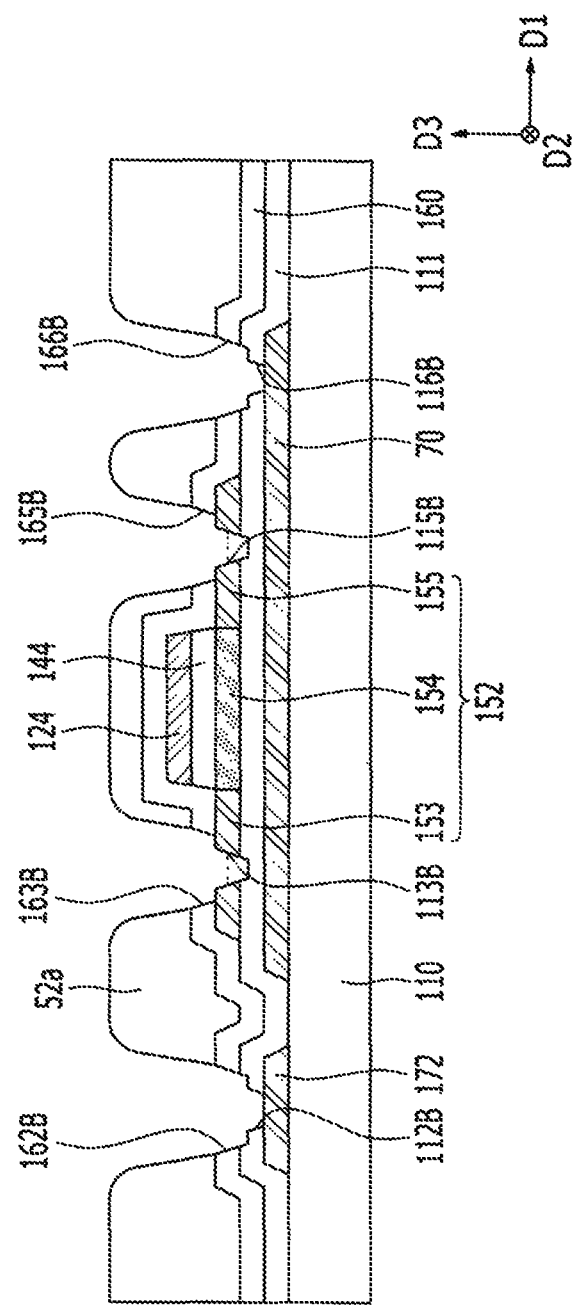
FIG. 28 and FIG. 29 are cross-sectional views sequentially showing process steps of a method of manufacturing a transistor array panel according to yet another exemplary embodiment of the invention.
Figure 29:
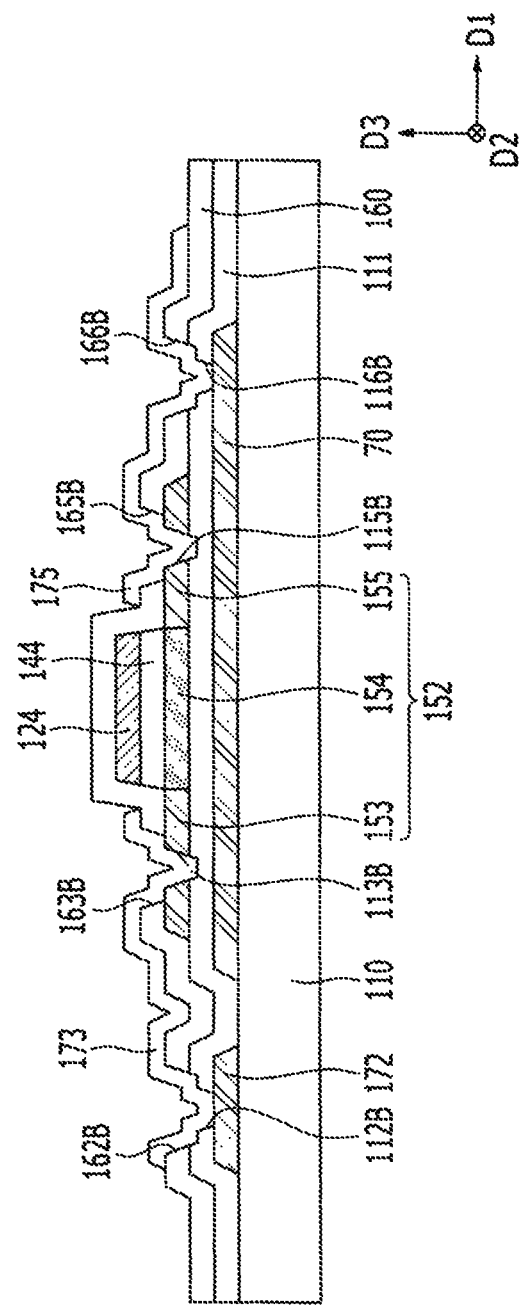

The manufacturing method of the transistor array panel according to the further exemplary embodiment of FIG. 28 and FIG. 29 is almost the same as the manufacturing method according to the exemplary embodiment shown in FIG. 23 to FIG. 27, however, with respect to the step of etching the portion that is not covered by the reduced mask pattern 52a by using the reduced mask pattern 52a as the etching mask, the exemplary embodiment of FIG. 28 and FIG. 29 is different.

Referring to FIG. 28, in various exemplary embodiments, the portion that is not covered by the reduced mask pattern 52a is etched by using the reduced mask pattern 52a as the mask. In this step, contact holes 162B, 163B, 165B, and 166B of the intermediate insulating layer 160, contact holes 112B and 116B of the buffer layer 111, and contact holes 113B and 115B of the semiconductor layer 152 are formed.

The contact holes 112B, 116B, 113B, 115B, 162B, 163B, 165B, and 166B are almost the same as the contact holes 112A, 116A, 113A, 115A, 162A, 163A, 165A, and 166A according to the exemplary embodiment shown in FIG. 25, however, in various exemplary embodiments the depth of the contact holes 162B and 166B may be different. In the etching step as depicted, the intermediate insulating layer 160 that is not covered by the reduced mask pattern 52a is removed, and at least part of the buffer layer 111 positioned under the removed intermediate insulating layer 160 is removed, as shown in FIG. 28, thereby the contact holes 162B and 166B extending to the inside of the buffer layer 111 may be formed. In some such embodiments, the cross-sectional thickness of the buffer layer 111 overlapping the contact holes 162B and 166B may be smaller than the cross-sectional thickness of the buffer layer 111 that is not overlapped with the contact holes 162B and 166B, for example, the buffer layer 111 overlapping the channel region 154.

In various exemplary embodiments, while the contact holes 162B and 166B are formed, the semiconductor layer 152 positioned under the removed intermediate insulating layer 160 is not substantially etched. Accordingly, in some such embodiments, the contact holes 163B and 165B are mainly formed in the intermediate insulating layer 160. Thus, in various exemplary embodiments, the contact holes 163B and 165Bdo not extend to the inside of the semiconductor layer 152. In some such embodiments, the etching gas used in the described etching step may have a very high etch rate for the buffer layer 111 and for the semiconductor layer 152.

The contact holes 113B and 115B of the semiconductor layer 152 may thus, in various exemplary embodiments, be extended to the buffer layer 111 as represented by a solid line, or may alternatively only be formed in the semiconductor layer 152 as represented by a dotted line. That is, in various exemplary embodiments, the semiconductor layer 152 is not removed, that is, fully etched away, such that the semiconductor layer 152 remains at the bottom of contact holes 113B and 115B.

Next, referring to FIG. 29, after removing the reduced mask pattern 52a, in various exemplary embodiments the conductive layer is deposited on the intermediate insulating layer 160 and may be patterned to form the upper conductive layer including the first connection part 173 and the second connection part 175.

Next, the manufacturing method of the transistor array panel according to another exemplary embodiment of the invention will be described with reference to FIG. 30 to FIG. 32 along with FIG. 6 to FIG. 17.

Figure 30:
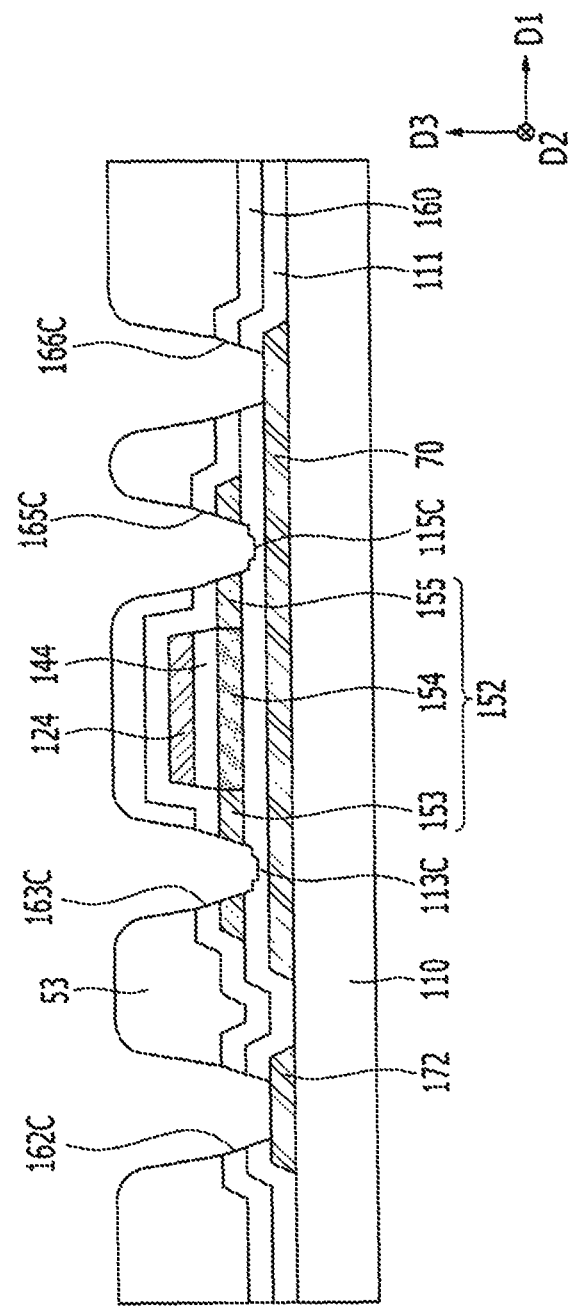
FIG. 30, FIG. 31A and FIG. 32 are cross-sectional views sequentially showing process steps of a method of manufacturing a transistor array panel according to another exemplary embodiment of the invention.
Figure 31A:
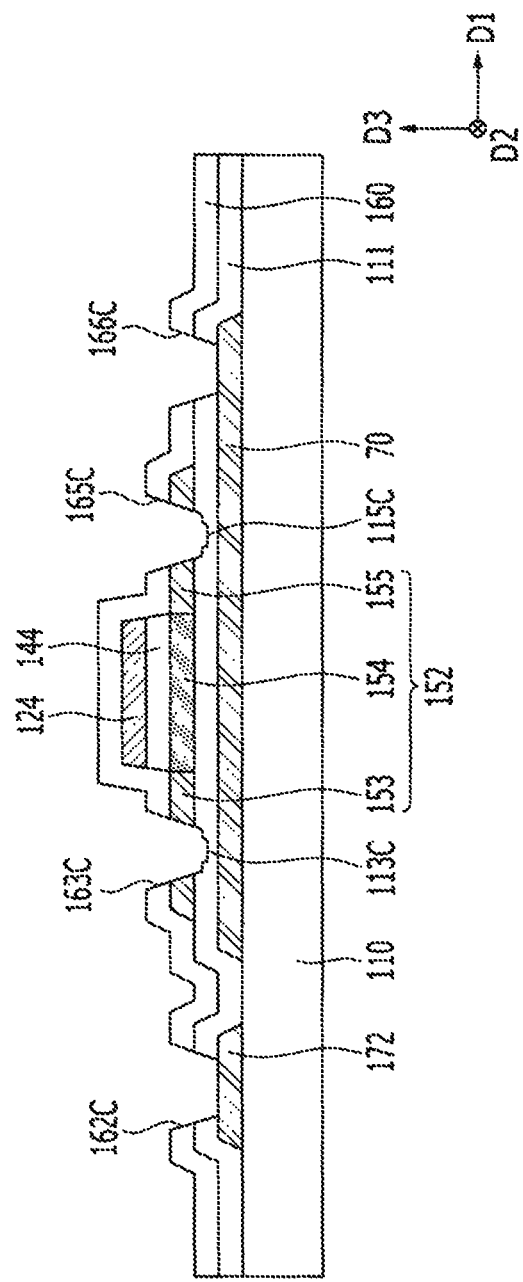
Figure 31B:
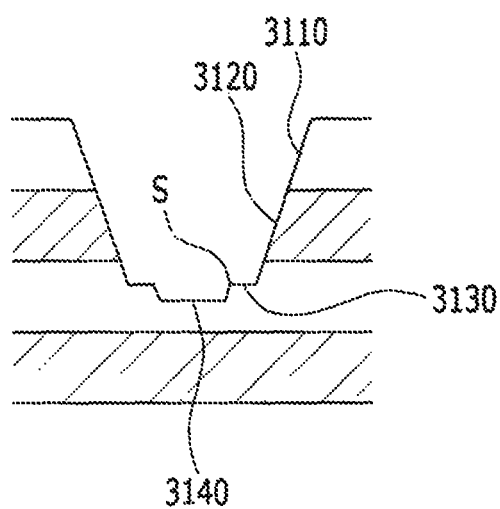
FIG. 31B and FIG. 31C are enlarged portions of detail shown in FIG. 31A, FIG. 33A and FIG. 34 are cross-sectional views sequentially showing process steps of a method of manufacturing a transistor array panel according to another exemplary embodiment of the invention.
Figure 31C:
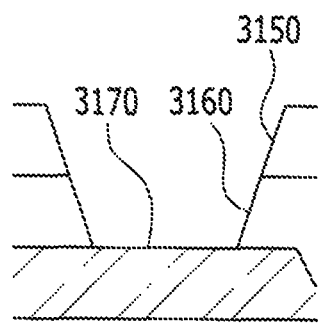
Figure 32:
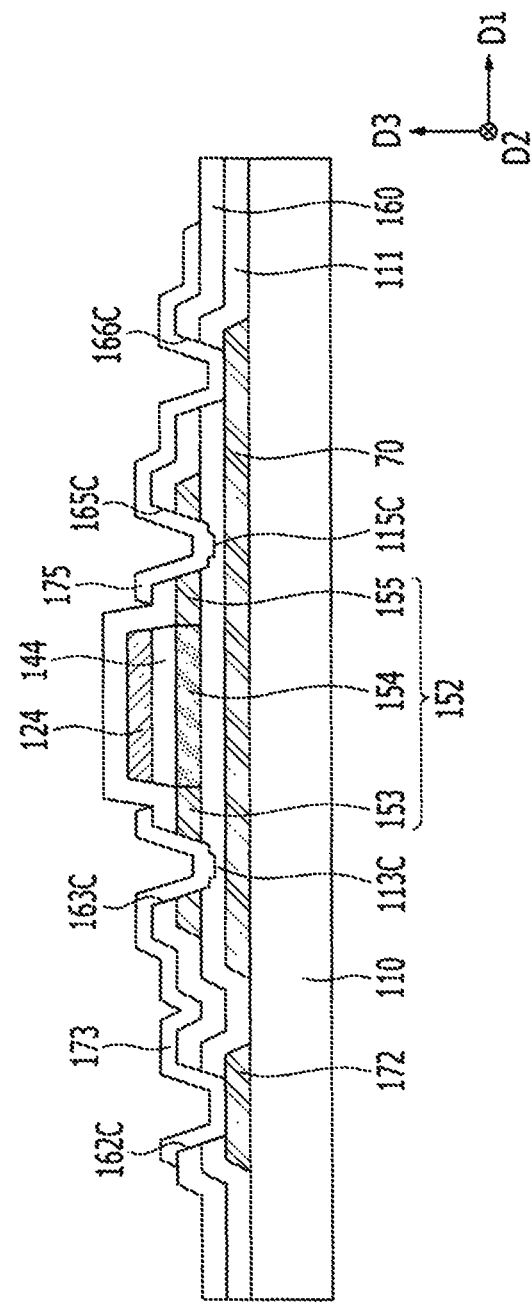

The manufacturing method of the transistor array panel according to the exemplary embodiment of FIG. 30 to FIG. 32 is the same as most of the manufacturing method according to the exemplary embodiment described in FIG. 6 to FIG. 17, however with respect to the step of etching the portion that is not covered by the reduced mask pattern 52a and is exposed by using the reduced mask pattern 52a as the etching mask, the exemplary embodiment of FIG. 30 to FIG. 32 is different.

In the further exemplary embodiment of FIG. 30 to FIG. 32, the portion that is not covered by the reduced mask pattern 52a and is exposed is etched by using the reduced mask pattern 52a as the etching mask to form contact holes 162C, 163C, 165C, and 166C and contact holes 113C and 115C. In some such embodiments, the buffer layer 111 and the semiconductor layer 152 corresponding to the contact holes 162C, 163C, 165C, and 166C of the intermediate insulating layer 160 may be removed.

The contact holes 162C and 166C may extend to the upper surface of the lower conductor 172 and the lower electrode 70. The contact holes 162C and 166C may be formed in the intermediate insulating layer 160 and the buffer layer 111, and the side surface thereof may be substantially flat.

The contact holes 163C and 165C may extend to the inside of the semiconductor layer 152 or the inside of the buffer layer 111. As shown in FIG. 30, the semiconductor layer 152 corresponding to the contact holes 163C and 165C of the intermediate insulating layer 160 may be removed such that only the side surface may be exposed instead of the upper surface of the semiconductor layer 152. In various exemplary embodiments, the contact holes 163C and 165C are formed in the intermediate insulating layer 160 and the semiconductor layer 152, and the side surface may be substantially flat. In some such embodiments, the contact holes 113C and 115C are not formed in the semiconductor layer 152 but may be formed in the buffer layer 111, and may form the side surface of the step shape along with the contact holes 163C and 165C of the intermediate insulating layer 160.

In various exemplary embodiments that are different than the embodiment depicted in FIG. 30, the contact holes 113C and 115C may be omitted. In some such embodiments, in the contact holes 163C and 165C of the intermediate insulating layer 160, the upper surface of the buffer layer 111 may be substantially flat.

Next, referring to FIG. 31A, in various exemplary embodiments, the reduced mask pattern 52a is removed, and as shown in FIG. 32, the conductive layer is deposited on the intermediate insulating layer 160 and is patterned to form the upper conductive layer including the first connection part 173 and the second connection part 175 as depicted. FIG. 31B shows enlarged detail of an exemplary contact hole from FIG. 31A, including a first side surface 3110, a second side surface 3120, and a bottom. In this embodiment, the bottom has two discrete sections 3130 and 3140 disposed at different levels in the contact hole. Section 3130 may be formed as a generally flat annular surface and section 3140 is a depression or inset extending beneath section 3130. A shoulder S is formed by a generally horizontally planar surface extending between the second side surface 3120 and the top of the inset formed by bottom section 3140. Thus, in this embodiment, the entirety of the shoulder S is formed in the bottom of the contact hole.

The first side surface 3110 and the second side surface 3120 both have a substantially constant slope. Further the slope of first side surface 3110 is essentially the same as the slope of the second side surface 3120. Still further, the first side surface 3110 is connected to the second side surface 3120 such that a substantially straight line is formed by the first side surface 3110 and the second side surface 3120 unaffected by a transition between layers defining the first side surface 3110 and the second side surface 3120. Thus, while the side walls of the this exemplary embodiment of a contact hole are generally contiguous, the bottom of this exemplary contact hole has a stepped shape.

FIG. 31C shows enlarged detail of another exemplary contact hole from FIG. 31A, including a first side surface 3150, a second side surface 3160, and a bottom 3170. As with the embodiment of the contact hole depicted in FIG. 31B, in the embodiment, the first side surface 3150 and the second side surface 3160 both have a substantially constant slope. Further the slope of first side surface 3150 is essentially the same as the slope of the second side surface 3160. Still further, the first side surface 3150 is connected to the second side surface 3160 such that a substantially straight, contiguous line is formed by the first side surface 3150 and the second side surface 3160 without a noticeable transition between layers defining the first side surface 3150 and the second side surface 3160. Thus, in the exemplary embodiment of a contact hole depicted in FIG. 31C, there is no shoulder joining discrete widths of the hole, and, the bottom 3170 is contiguous with the upper surface of the layer at the bottom 3170 of the exemplary contact hole.

Next, the manufacturing method of the transistor array panel according to an exemplary embodiment will be described with reference to FIG. 33A and FIG. 34 along with FIG. 6 to FIG. 17.

Figure 33A:
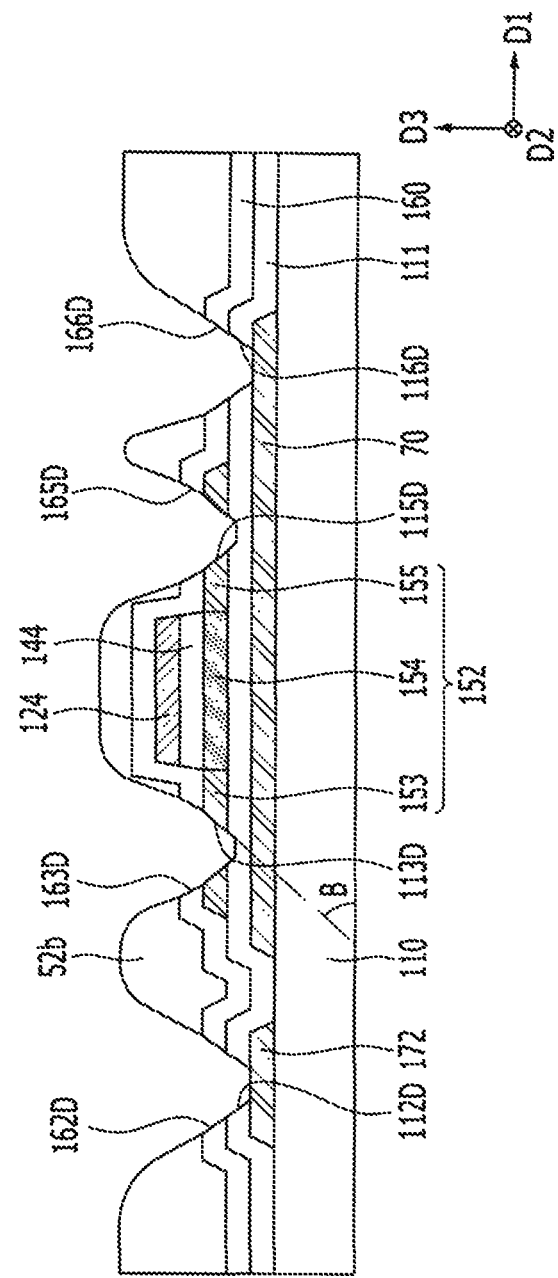
FIG. 33B is an enlarged portion of detail shown in FIG. 33A.
Figure 33B:
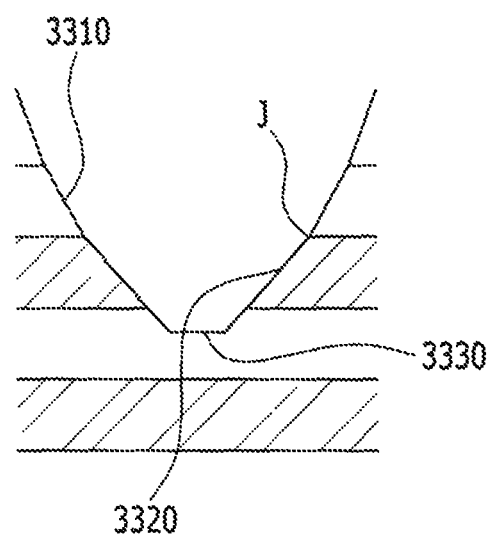
Figure 34:
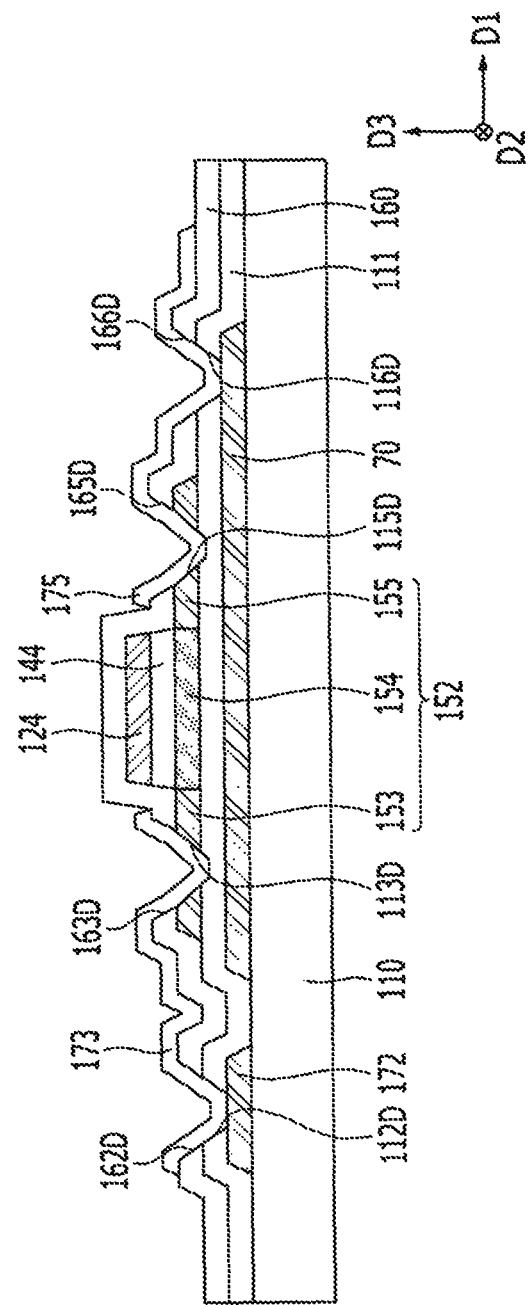

The manufacturing method of the transistor array panel according to the still further exemplary embodiment of FIG. 33A and FIG. 34 is the same as most of the manufacturing method according to the exemplary embodiment described in FIG. 6 to FIG. 17, however, with respect to the ashing step of the mask pattern 52, in the exemplary embodiment of FIG. 33A and FIG. 34, that step may be omitted.

FIG. 33B shows enlarged detail of an exemplary contact hole from FIG. 33A, including a first side surface 3310, a second side surface 3320 and a bottom 3130. In this embodiment, a junction J exists between the first side surface 3310 and the second side surface 3320. As with some the previously described embodiments of contact holes, in the contact hole depicted in FIG. 33B, the first side surface 3310 and the second side surface 3320 both have a substantially constant slope. However, the slope of first side surface 3310 is noticeably different than the slope of the second side surface 3320. Still further, the first side surface 3110 is connected to the second side surface 3120 such that the junction J denotes a transition between layers defining the first side surface 3310 and the second side surface 3320 such that a slope of the first side surface 3310 above junction J is different than a slope of the second side surface 3320 below junction J. Also, in this embodiment, the bottom 3330 extends into a bottom layer below the second side surface 3320.

According to various exemplary embodiments, as shown in FIG. 13, after the first etching for removing the intermediate insulating layer 160 by using the mask pattern 52 as the mask to form the hole 162a positioned on the lower conductor 172, the hole 166a positioned on the lower electrode 70, the hole 163a positioned on the source region 153, and the hole 165a positioned on the drain region 155, the intermediate insulating layer 160 and the buffer layer 111 that are not covered by the mask pattern 52 are etched along with the mask pattern 52. In some such embodiments, an etching gas of a different composition than the etching gas used in the first etching may be used. For example, an etching gas in which an oxygen-based gas and a fluorine-based gas are mixed may be used, and a ratio of the oxygen-based gas and the fluorine-based gas may be appropriately controlled to control the etching degree of the mask pattern 52. Accordingly, in various exemplary embodiments, an amount of the oxygen-based gas is controlled to be higher than an amount of the fluorine-based gas in the first etching to rapidly remove the mask pattern 52 rather than the intermediate insulating layer 160 and the buffer layer 111 such that the etch rate of the etching gas for the mask pattern 52 may be higher than the etch rate for the intermediate insulating layer 160 and the buffer layer 111. Also, in various exemplary embodiments, the etch rate of the etching gas for the intermediate insulating layer 160 and the buffer layer 111 may be higher than the etch rate for the semiconductor layer 152.

Accordingly, in various exemplary embodiments, as the mask pattern 52 is etched to be a reduced mask pattern 52b, the intermediate insulating layer 160 and the buffer layer 111 that are gradually exposed thereunder are gradually etched, and thereby, as shown in FIG. 33A, contact holes 162D, 166D, 112D, and 116D having the side surfaces with a smooth inclination for the upper surface of the substrate 110 may be formed in the intermediate insulating layer 160 and the buffer layer 111.

The inclination of the side surface of the contact holes 162D and 166D and the inclination of the side surface of the contact hole 112D and 116D may be similar. Accordingly, the contact hole 162D and the contact hole 112D may together substantially form one flat side surface and the contact hole 166D and the contact hole 116D may together substantially form one flat side surface, but the geometry in this location of the structure is not limited to one substantially flat side surface. For example, as described in detail elsewhere herein, some embodiments have a stepped geometry.

In various exemplary embodiments, as the mask pattern 52 is etched to be the reduced mask pattern 52b, the intermediate insulating layer 160 and the semiconductor layer 152 that are gradually exposed are also gradually etched, and thereby, as shown in FIG. 33A, the contact holes 163D, 165D, 113D, and 115D having the side surface forming the smooth inclination for the surface of the substrate 110 are formed in the intermediate insulating layer 160 and the semiconductor layer 152. The slope of the side surface of the contact holes 163D and 165D for the upper surface of the substrate 110 and the slope of the side surface of the contact holes 113D and 115D for the upper surface of the substrate 110 may depend on the selectivity of the etching gas and may be different from each other. Particularly, as shown in FIG. 33A, the slope of the side surface of the contact holes 113D and 115D formed in the semiconductor layer 152 may be smoother than the slope of the side surface of the contact holes 163D and 165D. The inner angle B of the side surface of the contact holes 113D and 115D of the semiconductor layer 152 for the upper surface of the substrate 110 may be about 10° and may be smaller than the inner angle A of the side surface of the contact holes 113 and 115 of the semiconductor layer 152 for the surface of the substrate 110. In other embodiments the slope angles have different values; and, in other embodiments the geometries also vary.

Alternatively, the manufacturing method of the transistor array panel according to these exemplary embodiments of the invention may be different from the manufacturing method according to the exemplary embodiment shown in FIG. 6 to FIG. 17. As described above in FIG. 12, after forming the mask pattern 52 on the intermediate insulating layer 160, not only is the intermediate insulating layer 160 etched, but the intermediate insulating layer 160 and the buffer layer 111 that are not covered by the mask pattern 52 are etched together along with the mask pattern 52. In some such embodiments, the dry etching method may be used. For example, the etching gas in which the oxygen-based gas and the fluorine-based gas are mixed may be used, and a ratio of the oxygen-based gas and the fluorine-based gas may be appropriately controlled to control the etching degree of the mask pattern 52. In the exemplary embodiments, the amount of the oxygen-based gas is controlled to be higher than the amount of the fluorine-based gas to rapidly remove the mask pattern 52 rather than the intermediate insulating layer 160 and the buffer layer 111 such that the etch rate of the etching gas for the mask pattern 52 may be controlled to be higher than the etch rate for the intermediate insulating layer 160 and the buffer layer 111.

Accordingly, as above-described, in various exemplary embodiments, as the mask pattern 52 is etched to be the reduced mask pattern 52b, the intermediate insulating layer 160 and the buffer layer 111 that are gradually exposed thereunder are gradually etched, and thereby, as shown in FIG. 33A, the contact holes 162D, 166D, 112D, and 116D having the smooth inclination for the surface of the substrate 110 are formed in the intermediate insulating layer 160 and the buffer layer 111, and the contact holes 163D, 165D, 113D, and 115D having the side surface with the smooth inclination for the surface of the substrate 110 are formed in the intermediate insulating layer 160 and the semiconductor layer 152.

Next, referring to FIG. 34, in various exemplary embodiments, after removing the reduced mask pattern 52b, the conductive layer is deposited on the intermediate insulating layer 160 and is patterned to form the upper conductive layer including the first connection part 173 and the second connection part 175.

According to various exemplary embodiments, although the exposed upper surface of the source region 153 and the drain region 155 of the semiconductor layer 152 corresponding to the contact holes 163D and 165D does not substantially exist, the inclination of the side surface of the semiconductor layer 152 is smooth for the surface of the substrate 110 in the contact holes 113D and 115D such that the contact area of the first connection part 173 and the second connection part 175 and the source region 153 and the drain region 155 of the semiconductor layer 152 may be widened, thereby reducing the contact resistance.

Next, the transistor array panel constructed according to yet another exemplary embodiment of the invention will be described with reference to FIG. 35 along with the above-described drawings.

Figure 35:
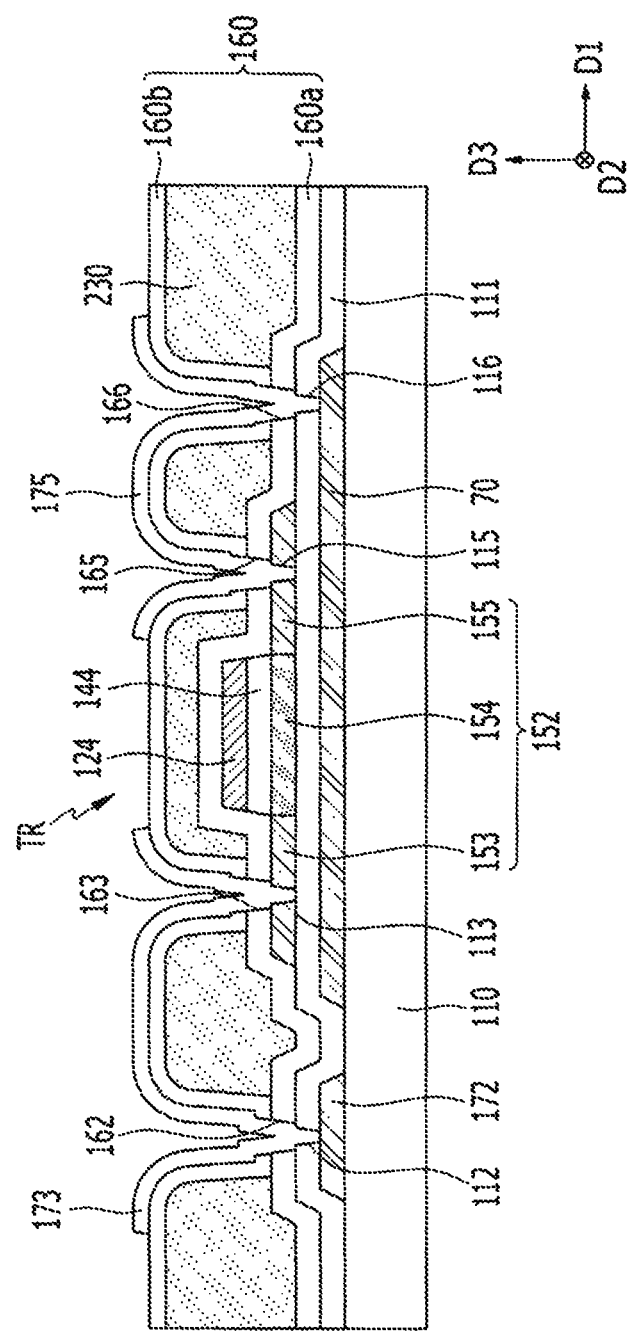
FIG. 35 is a cross-sectional view of a transistor array panel constructed according to yet another exemplary embodiment of the invention.

Referring to FIG. 35, in various exemplary embodiments, the transistor array panel according to the present exemplary embodiment is almost the same as the transistor array panel according to the several above-described exemplary embodiments, however the structure of the intermediate insulating layer 160 may be different. Accordingly, the intermediate insulating layer 160 may include the multilayer including a first layer 160a and a second layer 160b.

An organic layer 230 including the organic material may be further positioned between the first layer 160a and the second layer 160b of the intermediate insulating layer 160. The organic layer 230 may be a color filter, for example.

In various exemplary embodiments, the first layer 160a and the second layer 160b included in the intermediate insulating layer 160 include the contact holes 162, 163, 165, 166, 162A, 163A, 165A, 166A, 162B, 163B, 165B, 166B, 162C, 163C, 165C, 166C, 162D, 163D, 165D, and 166D. In some such embodiments, the other structures are the same as in the embodiments described above. Accordingly, for the sake of brevity, a detailed description thereof will be omitted.

Although certain exemplary embodiments and implementations have been described herein, other embodiments and modifications will be apparent from this description. Accordingly, the inventive concept is not limited to such embodiments, but rather to the broader scope of the appended claims and various obvious modifications and equivalent arrangements.

What is claimed is:

1. A transistor array panel comprising:
   a substrate;
   a buffer layer positioned on the substrate;
   a semiconductor layer positioned on the buffer layer;
   an intermediate insulating layer positioned on the semiconductor layer;
   an upper conductive layer positioned on the intermediate insulating layer;
   a lower conductive layer positioned between the substrate and the buffer layer,
   wherein the semiconductor layer includes a first contact hole,
   wherein the intermediate insulating layer includes a second contact hole positioned in an overlapping relationship with the first contact hole,
   wherein the upper conductive layer is in contact with a side surface of the semiconductor layer in the first contact hole,
   wherein the buffer layer comprises a third contact hole positioned over and exposing the lower conductive layer,
   wherein the intermediate insulating layer comprises a fourth contact hole positioned in an overlapping relationship with the third contact hole,
   wherein the lower conductive layer comprises a different material from a material of the semiconductor layer, and
   wherein the upper conductive layer is in contact with an upper surface of the buffer layer in the fourth contact hole, and is in contact with an upper surface of the lower conductive layer in the third contact hole.

2. The transistor array panel of claim 1, wherein a cross sectional area of the second contact hole is larger than a cross sectional area of the first contact hole.

3. The transistor array panel of claim 2, wherein the upper conductive layer is in contact with an upper surface of the semiconductor layer at a shoulder at a bottom of the second contact hole.

4. The transistor array panel of claim 3, wherein the first contact hole extends to or into an upper surface of the buffer layer such that the first contact hole passes entirely through the semiconductor layer on the buffer layer.

5. The transistor array panel of claim 4, wherein the first contact hole extends into the buffer layer such that a cross-sectional thickness of the buffer layer overlapping the first contact hole is smaller than a cross-sectional thickness of the buffer layer that does not overlap the first contact hole.

6. The transistor array panel of claim 4, wherein the upper conductive layer is in contact with the buffer layer in the first contact hole.

7. The transistor array panel of claim 4, wherein the first contact hole extends entirely through the semiconductor layer and into, but not entirely through, the buffer layer.

8. The transistor array panel of claim 1, wherein
   a cross sectional area of the fourth contact hole is larger than a cross sectional area of the third contact hole.

9. The transistor array panel of claim 1, wherein the lower conductive layer comprises a data line.

10. The transistor array panel of claim 1, wherein the substrate, the buffer layer, the semiconductor layer, the intermediate insulating layer and the upper conductive layer comprise a portion of a display panel.

11. A method of manufacturing a transistor array panel, the method comprising:
    forming a buffer layer on a substrate;
    forming a semiconductor layer on the buffer layer;
    forming an intermediate insulating layer on the semiconductor layer;
    forming a first mask pattern on the intermediate insulating layer;
    forming a first etching hole in the intermediate insulating layer by using the first mask pattern as an etching mask;
    removing a part of the first mask pattern to form a second mask pattern exposing an upper surface of the intermediate insulating layer around the first etching hole of the intermediate insulating layer; and
    removing the intermediate insulating layer and the semiconductor layer by using the second mask pattern as an etching mask to form a first contact hole in the semiconductor layer and a second contact hole in the intermediate insulating layer.

12. The method of claim 11, further comprising:
    after forming the second contact hole,
    removing the second mask pattern; and
    forming an upper conductive layer on the intermediate insulating layer,
    wherein the upper conductive layer is in contact with a side surface of the semiconductor layer in the first contact hole.

13. The method of claim 11, wherein
    before forming the buffer layer, a lower conductive layer is formed on the substrate,
    during the steps of forming the first contact hole and the second contact hole, the intermediate insulating layer and the buffer layer are removed by using the second mask pattern as the etching mask to form a third contact hole of the buffer layer and a fourth contact hole of the intermediate insulating layer, and
    the third contact hole exposes an upper surface of the lower conductive layer.

14. The method of claim 13 wherein the first and third holes are simultaneously formed in the same process step, and the second and fourth holes are simultaneously formed in the same process step.

15. The method of claim 11, wherein only etching material having a low or medium selectivity is used in the steps of forming the first etching hole, the first contact hole and the second contact hole.

16. A display panel, comprising:
a transistor array, the transistor array comprising:
   a substrate,
   a buffer layer positioned on the substrate;
   a semiconductor layer positioned on the buffer layer,
   an intermediate insulating layer positioned on the semiconductor layer,
   an upper conductive layer positioned on the intermediate insulating layer, and
   a lower conductive layer positioned between the substrate and the buffer layer,
   wherein the semiconductor layer and intermediate insulating layer defining a first contact hole having a stepped, cross sectional shape,
   wherein the upper conductive layer is in contact with a side surface of the intermediate insulating layer at an upper portion of the first contact hole, and
   wherein the upper conductive layer is in contact with a side surface of the semiconductor layer at a lower portion of the first contact hole;
   wherein the buffer layer comprises a third contact hole positioned over and exposing the lower conductive layer,
   wherein the intermediate insulating layer comprises a fourth contact hole positioned in an overlapping relationship with the third contact hole, and
   wherein the lower conductive layer comprises a different material from a material of the semiconductor layer;
   wherein the upper conductive layer is in contact with an upper surface of the buffer layer in the fourth contact hole, and is in contact with an upper surface of the lower conductive layer in the third contact hole.

17. The display panel of claim 16, wherein the upper portion of the first contact hole has a first width, the lower portion of the first contact hole has a second width smaller than the first width and the first contact hole has a shoulder at an intersection between the first and second widths.

18. The display panel of claim 16, wherein the stepped shape of the first contact hole is defined by a bottom surface of an upper portion of the first contact hole, a bottom surface of a the lower portion of the first contact hole, and a side wall connecting the bottom surfaces.

19. The display panel of claim 18, wherein the upper conductive layer is in contact with the buffer layer at a bottom portion of the first contact hole.

20. A layered transistor structure, comprising:
   a first layer;
   a second layer positioned adjacent the first layer and having a peripheral portion and a central portion;
   a third layer positioned adjacent the second layer at the central portion, the third layer not extending beyond the central portion to the peripheral portion;
   a fourth layer positioned adjacent the third layer at the central portion and directly on the second layer at the peripheral portion;
   a peripheral contact hole passing entirely through the fourth layer and entirely through the second layer to an upper surface of the first layer at the peripheral portion, and
   a central contact hole passing entirely through the fourth layer and at least partially into the third layer at the central portion.

* * * * *